US012613773B2

(12) United States Patent
Huang et al.

(10) Patent No.: US 12,613,773 B2
(45) Date of Patent: Apr. 28, 2026

(54) CONTROL CIRCUIT, CONTROL METHOD, AND SEMICONDUCTOR MEMORY

(71) Applicant: CXMT CORPORATION, Hefei (CN)

(72) Inventors: Zequn Huang, Hefei (CN); Kai Sun, Hefei (CN)

(73) Assignee: CXMT CORPORATION, Hefei (CN)

( * ) Notice: Subject to any disclaimer, the term of this patent is extended or adjusted under 35 U.S.C. 154(b) by 0 days.

(21) Appl. No.: 18/945,561

(22) Filed: Nov. 13, 2024

(65) Prior Publication Data

US 2025/0068513 A1 Feb. 27, 2025

Related U.S. Application Data

(63) Continuation of application No. PCT/CN2022/126383, filed on Oct. 20, 2022.

(30) Foreign Application Priority Data

Oct. 8, 2022 (CN) .......................... 202211219790.3

(51) Int. Cl.
G06F 11/00 (2006.01)
G06F 11/10 (2006.01)
(Continued)

(52) U.S. Cl.
CPC ...... G06F 11/106 (2013.01); G11C 11/40611 (2013.01); G11C 11/40615 (2013.01); G11C 11/4076 (2013.01); H03K 19/20 (2013.01)

(58) Field of Classification Search
CPC ............... G06F 11/106; G06F 11/1068; G11C 11/40611; G11C 11/40615; G11C 11/4087; G11C 29/52
See application file for complete search history.

(56) References Cited

U.S. PATENT DOCUMENTS 6,349,072 B1 * 2/2002 Origasa .................... G11C 7/22
365/189.05
6,501,701 B2 * 12/2002 Sadakata .................. G11C 8/06
365/189.16
(Continued)

FOREIGN PATENT DOCUMENTS

CN 112783686 A 5/2021
CN 114121075 A 3/2022
(Continued)

OTHER PUBLICATIONS

The Extended European Search Report issued in European corresponding application No. 22961260.1 mailed on Aug. 25, 2025, 10 pages.
(Continued)

*Primary Examiner* — Jonathan D Gibson
(74) *Attorney, Agent, or Firm* — Kilpatrick Townsend & Stockton LLP

(57) ABSTRACT

Provided are a control circuit, a control method, and a semiconductor memory. The control circuit includes a timing control module and a command control module. An output terminal of the timing control module is connected to an input terminal of the command control module. The timing control module is configured to receive a first clock signal, perform counting based on the first clock signal, generate an error check and scrub (ECS) flag signal, and send the ECS flag signal to the command control module. The ECS flag signal is in a valid state when a counting value meets a preset condition. The command control module is configured to receive the ECS flag signal, obtain a refresh command signal when the ECS flag signal is in the valid state, and generate an ECS command signal based on the refresh command signal.

20 Claims, 11 Drawing Sheets

(51) Int. Cl.
G11C 11/406 (2006.01)
G11C 11/4076 (2006.01)
H03K 19/20 (2006.01)

(56) References Cited

U.S. PATENT DOCUMENTS

| | | | | |
|---|---|---|---|---|
| 9,685,240 | B1* | 6/2017 | Park | G11C 11/40603 |
| 10,056,133 | B2* | 8/2018 | Baek | G11C 8/08 |
| 11,249,843 | B2 | 2/2022 | Song | |
| 11,295,799 | B2* | 4/2022 | Kim | G11C 11/40618 |
| 2007/0022244 | A1* | 1/2007 | Kimmery | G06F 11/106 |
| | | | | 711/106 |
| 2017/0060681 | A1* | 3/2017 | Halbert | G06F 3/0679 |
| 2017/0069371 | A1* | 3/2017 | Shin | G11C 11/40615 |
| 2018/0239671 | A1* | 8/2018 | Wei | G06F 12/0246 |
| 2018/0322931 | A1* | 11/2018 | Ha | G11C 16/3418 |
| 2019/0073261 | A1* | 3/2019 | Halbert | G06F 3/0679 |
| 2019/0188072 | A1 | 6/2019 | Kim et al. | |
| 2021/0141687 | A1* | 5/2021 | Song | G06F 3/0659 |
| 2021/0141691 | A1* | 5/2021 | Song | G06F 11/1068 |
| 2021/0142848 | A1* | 5/2021 | Lim | G11C 29/81 |
| 2022/0068361 | A1* | 3/2022 | Du | G11C 11/4076 |
| 2023/0153194 | A1* | 5/2023 | Song | G11C 8/06 |
| | | | | 714/807 |
| 2023/0185473 | A1* | 6/2023 | Choi | G06F 3/0652 |
| | | | | 711/154 |
| 2024/0248614 | A1* | 7/2024 | Jang | G06F 3/0673 |
| 2024/0419538 | A1* | 12/2024 | Huang | G06F 11/106 |
| 2025/0068513 | A1* | 2/2025 | Huang | G11C 29/42 |

FOREIGN PATENT DOCUMENTS

| | | | |
|---|---|---|---|
| CN | 114765037 | A | 7/2022 |
| CN | 115295040 | A | 11/2022 |

OTHER PUBLICATIONS

ISR Received in PCT /CN2022/126383; mailed Jun. 16, 2023.

* cited by examiner

20

CONTROL CIRCUIT, CONTROL METHOD, AND SEMICONDUCTOR MEMORY

CROSS-REFERENCES TO RELATED APPLICATIONS

The present disclosure is a continuation of PCT/CN2022/126383, filed on Oct. 20, 2022, which claims priority to the Chinese Patent Application No. 202211219790.3, filed on Oct. 8, 2022, and entitled "CONTROL CIRCUIT, CONTROL METHOD, AND SEMICONDUCTOR MEMORY", which are incorporated herein by reference in their entireties.

FIELD

The present disclosure relates to the field of integrated circuit technologies, and in particular, to a control circuit, a control method, and a semiconductor memory.

BACKGROUND

With the continuous development of semiconductor technologies, an increasingly high requirement is put forward for a data transmission speed in manufacturing and use of a device such as a computer. To obtain higher data transmission speeds, a series of devices such as a memory capable of transmitting data at a double data rate (DDR) have emerged.

A dynamic random access memory (DRAM) is used as an example. Complete error check and scrub (ECS) needs to be performed once on the DRAM at least every 24 hours. ECS includes an automatic operation mode and a manual operation mode. For a manual ECS operation, a multi-purpose command (MPC) is needed. For an automatic ECS operation, there is no MPC command, but an ECS command needs to be generated based on an Auto-Refresh command and a Self-Refresh command, to check wrong information and perform internal read/write error check and correction. However, the Self-Refresh command lacks an external clock for the automatic ECS operation, resulting in a failure in performing accurate counting based on refresh commands such as the Auto-Refresh command and the Self-Refresh command. Consequently, an error may be caused during generation of the ECS command, and performance of the memory is affected.

SUMMARY

Embodiments of the present disclosure provide a control circuit, a control method, and a semiconductor memory.

According to a first aspect, an embodiment of the present disclosure provides a control circuit. The control circuit includes a timing control circuit and a command control circuit. An output terminal of the timing control circuit is connected to an input terminal of the command control circuit.

The timing control circuit is configured to receive a first clock signal, perform counting based on the first clock signal, generate an error check and scrub (ECS) flag signal, and send the ECS flag signal to the command control circuit. The ECS flag signal is in a valid state when a counting value meets a preset condition.

The command control circuit is configured to receive the ECS flag signal, obtain a refresh command signal when the ECS flag signal is in the valid state, and generate an ECS command signal based on the refresh command signal.

In some embodiments, the timing control circuit is further configured to stop the counting when the ECS flag signal is in the valid state.

The command control circuit is further configured to generate a reset signal after generating the ECS command signal based on the refresh command signal, and send the reset signal to the timing control circuit, and in response to the reset signal, the timing control circuit starts counting again and controls the ECS flag signal to be in an invalid state.

In some embodiments, the command control circuit is further configured to output the received refresh command signal as an internal refresh signal when the ECS flag signal is in the invalid state.

In some embodiments, the timing control circuit includes a counting circuit and a decoding circuit. An output terminal of the counting circuit is connected to an input terminal of the decoding circuit.

The counting circuit is configured to receive the first clock signal, perform counting based on the first clock signal, and generate a counting signal. The counting signal is configured to represent a counting value.

The decoding circuit is configured to receive the counting signal, and perform decoding processing on the counting signal, to obtain a target counting signal. The target counting signal is in a valid state when the counting value meets the preset condition.

In some embodiments, the counting circuit includes an asynchronous binary counter. The asynchronous binary counter includes several sequentially cascaded flip-flops. An input terminal of each stage of flip-flop is connected to a second output terminal of this stage of flip-flop. The second output terminal of each stage of flip-flop is connected to a clock terminal of a next stage of flip-flop. A clock terminal of a first stage of flip-flop is connected to the first clock signal.

In some embodiments, the counting circuit includes a synchronous binary counter. The synchronous binary counter includes several sequentially cascaded flip-flops. Clock terminals of the several flip-flops are all connected to the first clock signal.

In some embodiments, the timing control circuit further includes a latch circuit. The latch circuit is connected to an output terminal of the decoding circuit. The latch circuit is configured to receive the target counting signal, and perform latch processing on the target counting signal when the target counting signal is in the valid state, to generate the ECS flag signal in the valid state.

In some embodiments, the timing control circuit further includes an auto pulse circuit and a latch circuit. An input terminal of the auto pulse circuit is connected to an output terminal of the decoding circuit. An output terminal of the auto pulse circuit is connected to a set terminal of the latch circuit.

The auto pulse circuit is configured to generate a set signal based on the target counting signal. The set signal is in a valid state when the target counting signal is in the valid state.

The latch circuit is configured to receive the set signal, and generate the ECS flag signal in the valid state based on the set signal when the set signal is in the valid state.

In some embodiments, the auto pulse circuit includes a delay-inversion circuit and a first AND gate. Both a first input terminal of the first AND gate and an input terminal of the delay-inversion circuit are connected to the output terminal of the decoding circuit. A second input terminal of the first AND gate is connected to an output terminal of the delay-inversion circuit. An output terminal of the first AND gate, as the output terminal of the auto pulse circuit, is connected to the set terminal of the latch circuit.

The delay-inversion circuit is configured to perform delay and inversion processing on the target counting signal, to obtain an inverted target counting signal.

The first AND gate is configured to perform an AND logical operation on the inverted target counting signal and the target counting signal, to obtain the set signal.

In some embodiments, the command control circuit includes a sampling circuit, a first delay circuit, and a logic processing circuit.

The sampling circuit is configured to receive the refresh command signal and the ECS flag signal, and perform sampling processing on the ECS flag signal based on the refresh command signal, to obtain a sampled signal.

The first delay circuit is configured to perform delay processing on the refresh command signal, to obtain a delayed refresh signal.

The logic processing circuit is configured to perform a logical operation on the sampled signal and the delayed refresh signal, select and output, when the sampled signal is in a valid state, the ECS command signal for performing an ECS operation, and select and output, when the sampled signal is in an invalid state, an internal refresh signal for performing a refresh operation. The sampled signal is in the valid state when the ECS flag signal is in the valid state, and the sampled signal is in the invalid state when the ECS flag signal is in the invalid state.

In some embodiments, the logic processing circuit includes a first logic circuit and a second logic circuit.

The first logic circuit is configured to perform a first logical operation on the sampled signal and the delayed refresh signal when the sampled signal is in the valid state, to output the ECS command signal.

The second logic circuit is configured to perform a second logical operation on the sampled signal and the delayed refresh signal when the sampled signal is in the invalid state, to output the internal refresh signal.

In some embodiments, the first logic circuit includes a first NAND gate and a first NOT gate. A first input terminal of the first NAND gate is connected to an output terminal of the sampling circuit. A second input terminal of the first NAND gate is connected to an output terminal of the first delay circuit. An output terminal of the first NAND gate is connected to an input terminal of the first NOT gate.

The first NAND gate is configured to perform a NAND logical operation on the sampled signal and the delayed refresh signal when the sampled signal is in the valid state, to obtain a first intermediate signal.

The first NOT gate is configured to perform a NOT logical operation on the first intermediate signal, to obtain the ECS command signal.

In some embodiments, the second logic circuit includes a second NAND gate, a second NOT gate, and a third NOT gate. A first input terminal of the second NAND gate is connected to an output terminal of the second NOT gate. A second input terminal of the second NAND gate is connected to an output terminal of the first delay circuit. An output terminal of the second NAND gate is connected to an input terminal of the third NOT gate.

The second NOT gate is configured to perform a NOT logical operation on the sampled signal when the sampled signal is in the invalid state, to obtain a second intermediate signal.

The second NAND gate is configured to perform a NAND logical operation on the second intermediate signal and the delayed refresh signal, to obtain a third intermediate signal.

The third NOT gate is configured to perform a NOT logical operation on the third intermediate signal, to obtain the internal refresh signal.

In some embodiments, a delay time of the first delay circuit is greater than a sum of a delay time of the sampling circuit and a delay time of the second NOT gate.

In some embodiments, the command control circuit further includes a second delay circuit. The second delay circuit is configured to perform delay processing on the ECS command signal to generate the reset signal, and send the reset signal to a reset terminal of the latch circuit, so that the counting circuit starts counting again and controls the ECS flag signal to be in the invalid state.

In some embodiments, the control circuit further includes a clock generation circuit. The clock generation circuit is configured to generate the first clock signal.

In some embodiments, the clock generation circuit includes an oscillation circuit and a frequency division circuit.

The oscillation circuit is configured to output a second clock signal of a preset frequency.

The frequency division circuit is configured to perform n frequency division processing on the second clock signal, to obtain the first clock signal. A frequency of the first clock signal is one nth of the preset frequency, and n is an integer greater than 0.

In some embodiments, the refresh command signal includes at least one of an auto-refresh signal and a self-refresh signal.

According to a second aspect, an embodiment of the present disclosure provides a control method. The method includes the steps as follows.

A timing control circuit receives a first clock signal, performs counting based on the first clock signal, generates an ECS flag signal, and sends the ECS flag signal to a command control circuit. The ECS flag signal is in a valid state when a counting value meets a preset condition.

The command control circuit receives the ECS flag signal, obtains a refresh command signal when the ECS flag signal is in the valid state, and generates an ECS command signal based on the refresh command signal.

According to a third aspect, an embodiment of the present disclosure provides a semiconductor memory. The semiconductor memory includes the control circuit according to any item of the first aspect.

In some embodiments, the semiconductor memory includes a dynamic random access memory (DRAM).

Embodiments of the present disclosure provide a control circuit, a control method, and a semiconductor memory. The control circuit includes a timing control circuit and a command control circuit. An output terminal of the timing control circuit is connected to an input terminal of the command control circuit. The timing control circuit is configured to receive a first clock signal, perform counting based on the first clock signal, generate an ECS flag signal, and send the ECS flag signal to the command control circuit. The ECS flag signal is in a valid state when a counting value meets a preset condition. The command control circuit is configured to receive the ECS flag signal, obtain a refresh command signal when the ECS flag signal is in the valid state, and generate an ECS command signal based on the refresh command signal. In this way, counting is performed based on the first clock signal after the first clock signal is received. The ECS flag signal is in the valid state only when the counting value meets the preset condition. Then, the refresh command signal is obtained to generate the ECS command signal for performing an ECS operation. Therefore, a technical problem that an ECS command signal cannot be generated based on a self-refresh command in a related technology can be resolved. In addition, an interval time of the ECS operation is planned by the timing control circuit, so that the ECS command signal can be accurately generated, thereby ensuring completion of all error check and scrub within 24 hours, and finally improving memory performance.

DETAILED DESCRIPTION OF THE DISCLOSURE

The following clearly describes the technical solutions in the embodiments of the present disclosure with reference to the accompanying drawings in the embodiments of the present disclosure. It may be understood that a specific embodiment described herein is merely intended to explain related disclosure, but is not intended to limit the present disclosure. In addition, it should be further noted that, for ease of description, only a part related to the related disclosure is shown in the accompanying drawings.

Unless otherwise defined, all technical and scientific terms used herein have the same meaning as generally understood by a person skilled in the technical field of the present disclosure. The terms used herein are merely intended to describe the embodiments of the present disclosure, and are not intended to limit the present disclosure.

The following description relates to "some embodiments" describing a subset of all the possible embodiments. However, it may be understood that "some embodiments" may be the same or different subsets of all the possible embodiments, and may be combined with each other in the case of no conflict.

It should be noted that the term "first\second\third" in the embodiments of the present disclosure is merely intended to distinguish between similar objects, and does not represent specific sorting for the objects. It may be understood that "first\second\third" may be interchanged for a specific sequence or order if allowed, so that the embodiments of the present disclosure described herein can be implemented in a sequence other than those shown or described herein.

Before the embodiments of the present disclosure are further described in detail, nouns and terms in the embodiments of the present disclosure are first described. The nouns and the terms in the embodiments of the present disclosure are applicable to the following explanations:

dynamic random access memory (DRAM);
synchronous dynamic random access memory (SDRAM);
double data rate (DDR);
DDR5 specification (DDR5 SPEC);
multi-purpose command (MPC); and
error check and scrub (ECS).

Figure 1:
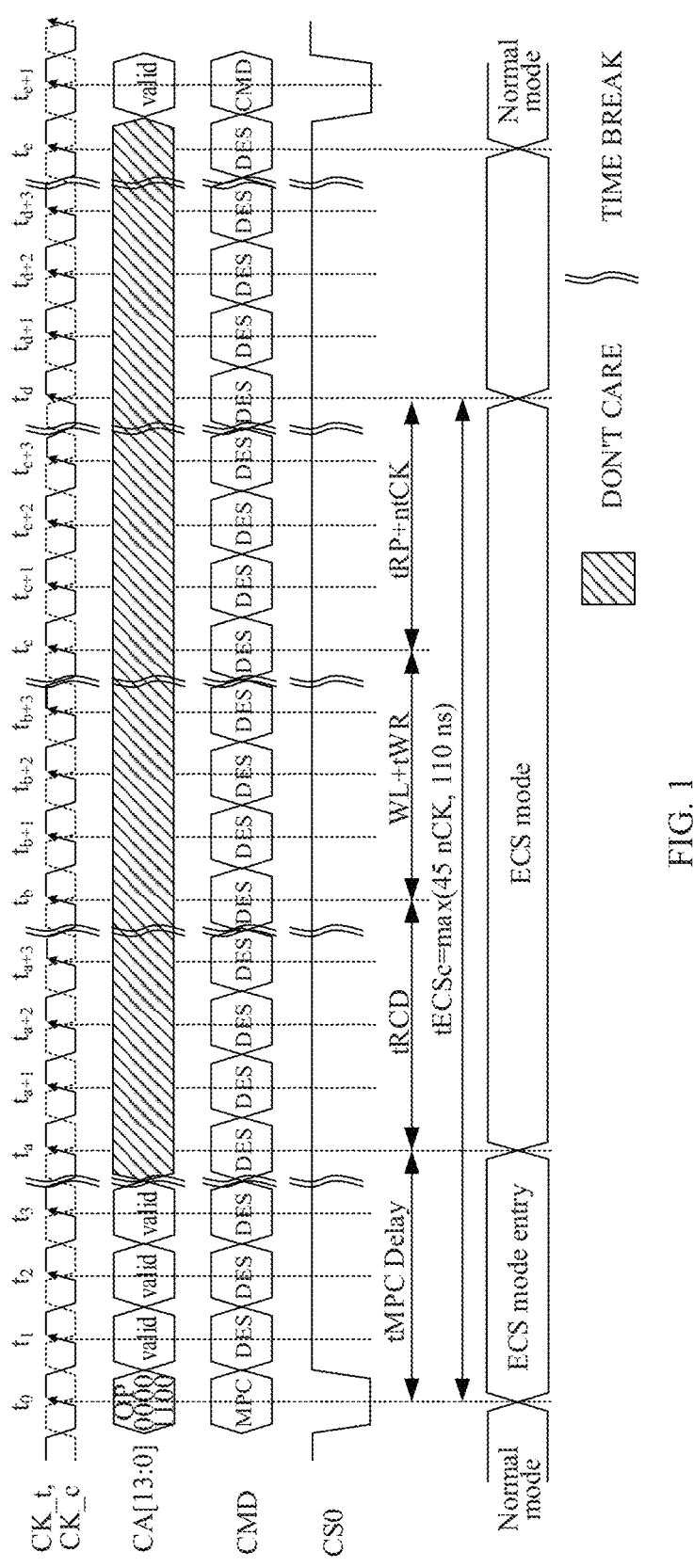
FIG. 1 is a schematic diagram of signal timing in an ECS mode.

A DDR5 DRAM is used as an example. A complete ECS operation needs to be performed once on the DRAM at least within 24 hours. Therefore, it is necessary to plan a time for the ECS operation. To implement complete error check and scrub on the DRAM, in the embodiments of the present disclosure, error check needs to be performed on all rows (Row), columns (Col), banks (BA), and bank groups (BG) in the DRAM. Therefore, the ECS operation needs to be performed for multiple times within 24 hours with an average interval time of tECSint, which is about 0.644 milliseconds in an example of a 16-gigabyte (Gb) memory. The interval time is a minimum time for completing the ECS operation for the entire 16 Gb memory within 24 hours. A specific calculation manner is 24 hours×60 minutes/hour×60 seconds/minute/$2^{(3+2+16+6)}$. $2^3$ is a quantity of BGs, $2^2$ is a quantity of banks in each BG, $2^{16}$ is a quantity of rows in one bank, and $2^6$ is a quantity of times of an operation required for accessing all Col on one row. FIG. 1 is a schematic diagram of signal timing in an ECS mode. As shown in FIG. 1, CK_t and CK_c represent a pair of complementary clock signals, CA[13:0] represents a command address signal, CMD represents a command signal, CS0 represents a chip select signal being valid at a low level, valid represents a valid command address, and DES represents an invalid command. A command signal at a moment t0 is an MPC command, and a corresponding command address is OP00001100. In this case, a normal mode is switched to ECS mode entry. ECS mode entry is switched to the ECS mode after a delay time (e.g., tMPC Delay). In the ECS mode, a sequence of internal self-generated command signals of a DRAM is an active signal (ACT), a read signal (RD), a write signal (WR), and a precharge signal (PRE) when an ECS operation is performed once. tRCD represents an interval time between ACT and RD, WL represents an interval time between RD and WR, tWR represents an interval time between WR and PRE, and tRP represents a precharge time. That is, DDR5 SPEC specifies that a minimum time for performing the ECS operation each time is tECSc. In this time period, internal read/write error check and correction needs to be performed on a Col corresponding to a row in a bank in a BG through one ECS operation. Therefore, the internal self-generated commands ACT-RD-WR-PRE are required. Every two adjacent commands meet timing tRCD, WL, or tWR. Therefore, an internal operation of executing an ECS command once can be completed within tECSc. For example, Table 1 shows interval time specifications for the ECS operation under different memory conditions.

TABLE 1

| Configuration | 8 Gb | 16 Gb |
|---|---|---|
| x4, x8, x16 | 1.287 milliseconds | 0.644 milliseconds |

It may be understood that ECS modes may be classified as an automatic ECS operation mode and a manual ECS operation mode. In the manual ECS operation mode, an ECS command signal is generated based on an MPC command sent by a memory controller. In the automatic ECS operation mode, an ECS command signal may be generated through auto-refresh or self-refresh. Although the ECS operation can be generated based on a particular MPC command, there is no MPC command in the automatic ECS operation mode. Therefore, an ECS command for an automatic ECS operation needs to be generated through auto-refresh and self-refresh. Because complete error check and scrub needs to be completed once for the DRAM within 24 hours, a timing control circuit is required in the automatic ECS operation mode to plan the interval time of the ECS operation. In the embodiments of the present disclosure, an auto-refresh command and a self-refresh command may be obtained in a counting manner to generate the ECS command for the automatic ECS operation, to ensure completion of error check and scrub for full arrays in the DRAM within 24 hours. However, a quantity of auto-refresh commands and a quantity of self-refresh commands need to be counted when the ECS command signal is generated based on the refresh command. In addition, a signal of a fixed frequency needs to be used in the embodiments of the present disclosure as a clock signal of a counting circuit because there is no external clock during self-refresh.

In addition, a next refresh command is obtained when counting meets a preset condition, to generate the ECS command for the automatic ECS operation. However, the ECS command signal cannot be generated based on the refresh command if there is a time period between the next refresh command and a counting completion moment. Therefore, how to preempt the next refresh command as the ECS command for the automatic ECS operation is a technical problem to be resolved in the embodiments of the present disclosure.

Based on this, an embodiment of the present disclosure provides a control circuit. Counting is performed based on a first clock signal after the first clock signal is received. An ECS flag signal is in a valid state only when a counting value meets a preset condition. Then, a refresh command signal is obtained to generate an ECS command signal for performing an ECS operation. Therefore, a technical problem that an ECS command signal cannot be generated based on a self-refresh command in a related technology can be resolved, and the ECS command signal can be further accurately generated, thereby ensuring completion of all error check and scrub within 24 hours, and finally improving memory performance.

The embodiments of the present disclosure are described below in detail with reference to the accompanying drawings.

Figure 2:
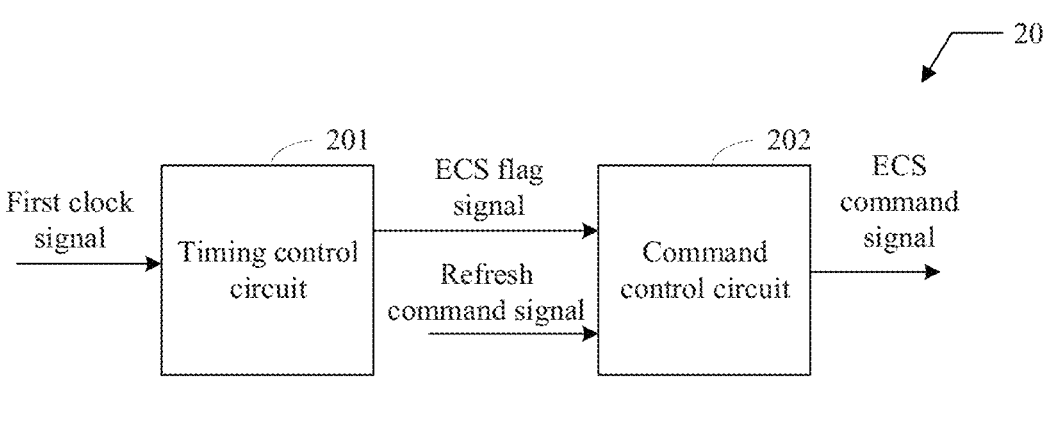
FIG. 2 is a schematic diagram 1 of a compositional structure of a control circuit according to an embodiment of the present disclosure.

In an embodiment of the present disclosure, FIG. 2 is a schematic diagram of a compositional structure of a control circuit 20 according to an embodiment of the present disclosure. As shown in FIG. 2, the control circuit 20 may include a timing control circuit 201 and a command control circuit 202. An output terminal of the timing control circuit 201 is connected to an input terminal of the command control circuit 202.

The timing control circuit 201 is configured to receive a first clock signal, perform counting based on the first clock signal, generate an ECS flag signal, and send the ECS flag signal to the command control circuit 202. The ECS flag signal is in a valid state when a counting value meets a preset condition.

The command control circuit 202 is configured to receive the ECS flag signal, obtain a refresh command signal when the ECS flag signal is in the valid state, and generate an ECS command signal based on the refresh command signal.

It should be noted that, in this embodiment of the present disclosure, the control circuit 20 may be applied to a related circuit performing an ECS operation, and may be specifically a circuit applicable to all automatic ECS operations. In an automatic ECS operation mode, an interval time for generating the ECS command signal is planned, so that complete error check and scrub can be performed once on a memory at least within 24 hours.

It should be further noted that, in this embodiment of the present disclosure, a DDR5 DRAM is used as an example. Because it is required to perform complete error check and scrub once on the DRAM at least within 24 hours, the interval time of the ECS operation needs to be planned by the timing control circuit 201 in the automatic ECS operation mode, to ensure completion of all error check and scrub within 24 hours. That is, counting is performed by the timing control circuit 201 based on the received first clock signal, and the ECS flag signal is in the valid state when the counting value meets the preset condition. In this case, the refresh command signal is obtained by the command control circuit 202, to generate the ECS command signal for performing the ECS operation. It should be noted that the refresh command signal obtained in this case is a refresh command signal appearing after the counting value meets the preset condition. Therefore, the refresh command signal obtained in this case specifically refers to a refresh command signal appearing at a next moment relative to a moment at which the counting value meets the preset condition, or may be referred to as a next refresh command signal for short. In this way, the interval time of the ECS operation is planned based on whether the counting value meets the preset condition, and it can be ensured that all error check and scrub is completed within 24 hours.

In some embodiments, the refresh command signal herein may include at least one of an auto-refresh signal and a self-refresh signal. In this embodiment of the present disclosure, the auto-refresh signal (or referred to as an "auto-refresh command") may be represented by REFab, and the self-refresh signal (or referred to as a "self-refresh command") may be represented by Self_REF.

It should be noted that, in the automatic ECS operation mode, DDR5 SPEC specifies that the ECS command signal needs to be planned and generated during auto-refresh and self-refresh for the automatic ECS operation, to check wrong information and perform internal read/write error check and correction. However, a quantity of auto-refresh commands (AREF) and a quantity of self-refresh commands (SREF) need to be counted when an automatic ECS operation command is generated based on the refresh command signal, but there is no external clock during self-refresh. Therefore, the first clock signal in this embodiment of the present disclosure may be a signal of a fixed frequency as a clock signal for counting, thereby resolving a technical problem that an ECS command signal cannot be generated through self-refresh in a related technology.

Figure 3:
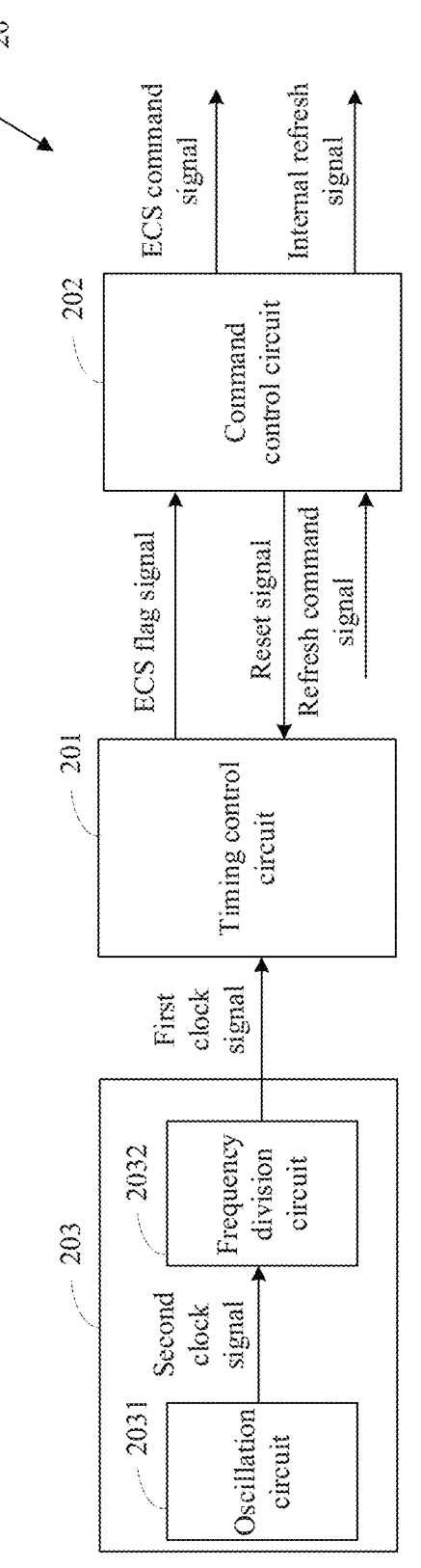
FIG. 3 is a schematic diagram 2 of a compositional structure of a control circuit according to an embodiment of the present disclosure.

In some embodiments, for the first clock signal, as shown in FIG. 3, the control circuit 20 may further include a clock generation circuit 203 based on the control circuit 20 shown in FIG. 2.

The clock generation circuit 203 is configured to generate the first clock signal.

In a specific embodiment, as shown in FIG. 3, the clock generation circuit 203 may include an oscillation circuit 2031 and a frequency division circuit 2032.

The oscillation circuit 2031 is configured to generate a second clock signal of a preset frequency.

The frequency division circuit 2032 is configured to perform n frequency division processing on the second clock signal, to obtain the first clock signal.

It should be noted that, in this embodiment of the present disclosure, a frequency of the first clock signal is one nth of the preset frequency, and n is an integer greater than 0.

It should also be noted that, in this embodiment of the present disclosure, the oscillation circuit 2031 may be an oscillator (OSC), e.g., a ring oscillator (Ring OSC), a crystal oscillator (Crystal OSC), or the like. Herein, the oscillation circuit 2031 is a ring OSC, and is configured to generate the second clock signal of the fixed frequency. Then frequency division processing is performed on the second clock signal by the frequency division circuit 2032, to obtain the first clock signal for counting. The second clock signal may be represented by OSC_CLK, and the first clock signal may be represented by ECS_CLK.

For example, an OSC_CLK signal of a fixed frequency may be generated by the ring OSC. It is assumed that a clock frequency is 1818 kilohertz (kHz), and a corresponding clock period is 550 nanoseconds (ns). An ECS_CLK signal whose clock frequency is 227 kHz is output after frequency division processing, and a corresponding clock period of the ECS_CLK signal is 4.4 microseconds (μs). In this way, the required first clock signal can be generated because the control circuit 20 includes the clock generation circuit 203, thereby resolving a technical problem that there is no external clock during self-refresh.

Further, for the timing control circuit 201 and the command control circuit 202, in some embodiments, the timing control circuit 201 is further configured to stop counting when the ECS flag signal is in the valid state.

The command control circuit 202 is further configured to generate a reset signal after generating the ECS command signal based on the refresh command signal, and send the reset signal to the timing control circuit 201, and in response to the reset signal, the timing control circuit 201 starts counting again and controls the ECS flag signal to be in an invalid state.

It should be noted that, in this embodiment of the present disclosure, the ECS flag signal may be represented by ECS_Flag, and the reset signal may be represented by RESET. Herein, ECS_Flag may be in the valid state or the invalid state. The ECS_Flag signal in the valid state is generated by the timing control circuit 201 at a time interval, to generate the ECS command signal. Then, the RESET signal is generated and sent to the timing control circuit 201, so that the ECS_Flag signal is in the invalid state, and the timing control circuit 201 starts counting again.

In some embodiments, the command control circuit 202 is further configured to output the received refresh command signal as an internal refresh signal when the ECS flag signal is in the invalid state.

Specifically, level values of the ECS flag signal may include a first value and a second value. The first value may be logic 1 indicating a high level, and the second value may be logic 0 indicating a low level. Alternatively, the first value may be logic 0 indicating a low level, and the second value may be logic 1 indicating a high level. This is not limited.

For example, it may be determined that the ECS flag signal is in the valid state if the level value of the ECS flag signal is the logic 1; or it may be determined that the ECS flag signal is in the invalid state if the level value of the ECS flag signal is the logic 0.

It should be further noted that, in this embodiment of the present disclosure, a refresh command signal received at a next moment may be preempted if the ECS flag signal is in the valid state, and the ECS command signal is generated based on the refresh command signal. In this case, a corresponding preempted refresh command signal disappears, so that the ECS operation is performed. The refresh command signal is not preempted if the ECS flag signal is in the invalid state, and is directly output as the internal refresh signal, to perform a refresh operation. The ECS command signal may be represented by ECS_CMD, and the internal refresh signal may be represented by REF_NEW.

Figure 4:
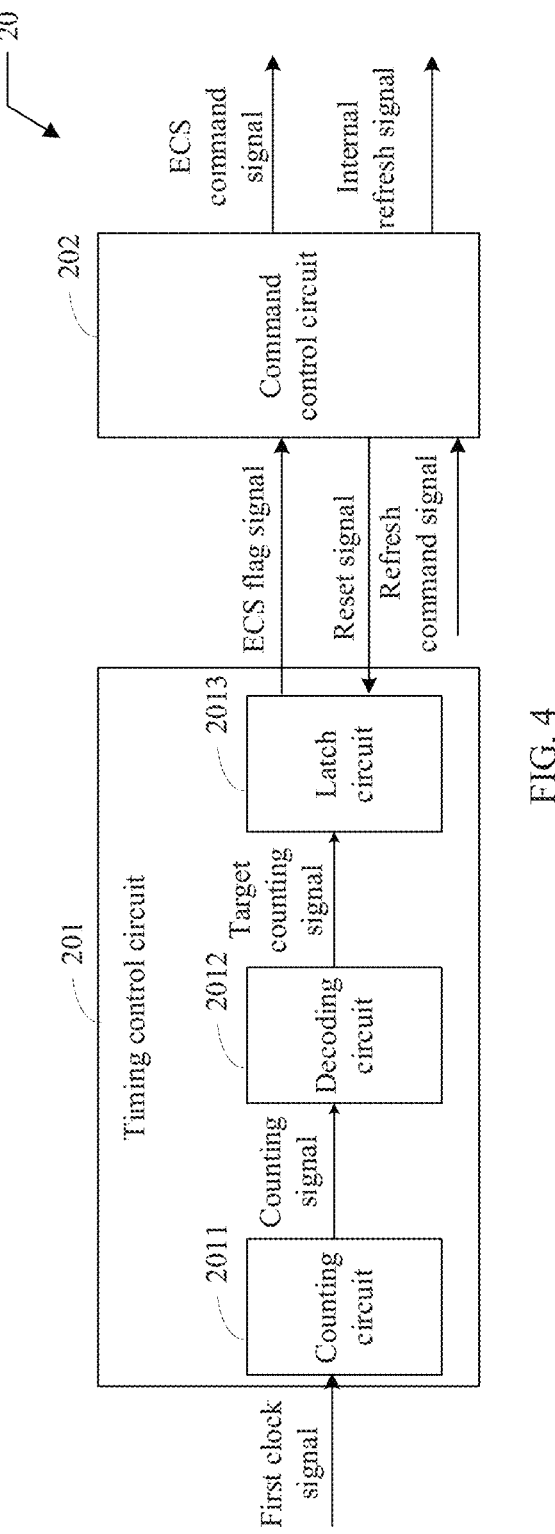
FIG. 4 is a schematic diagram 3 of a compositional structure of a control circuit according to an embodiment of the present disclosure.

In some embodiments, for the timing control circuit 201, as shown in FIG. 4, the timing control circuit 201 may include a counting circuit 2011 and a decoding circuit 2012 based on the control circuit 20 shown in FIG. 2. An output terminal of the counting circuit 2011 is connected to an input terminal of the decoding circuit 2012.

The counting circuit 2011 is configured to receive the first clock signal, perform counting based on the first clock signal, and generate a counting signal. The counting signal is configured to represent a counting value.

The decoding circuit 2012 is configured to receive the counting signal, and perform decoding processing on the counting signal, to obtain a target counting signal. The target counting signal is in a valid state when the counting value meets the preset condition.

It should be noted that, in FIG. 4, the counting signal may be represented by Code<N:0>, and the target counting signal may be represented by ECS_CNT. The counting signal is not just a signal, but represents a group of signals. Herein, the counting signal may include N+1 bits, and each bit corresponds to one signal, which may be specifically: Code<0>, Code<1>, Code<2>, . . . , and Code<N>. A value of N is associated with a quantity of flip-flops in the counting circuit 2011.

For example, it is assumed that there are eight flip-flops in the counting circuit 2011, and then the value of N is equal to 7. For example, to complete error check and scrub once for a DRAM within 24 hours with a memory configuration of 16 Gb, the time interval of the ECS operation is 644 μs, a period of the first clock signal is 4.4 μs, and then counting needs to be performed for about 644/4.4=146 times to indicate that counting is performed once. That is, counting is performed based on the first clock signal to obtain the counting signal Code<7:0> representing a counting value. The ECS_CNT signal is in a valid state only when the counting signal Code<7:0> meets 10010010, that is, the counting value reaches 146 (herein, $2^1+2^4+2^7=146$). In this case, the ECS flag signal in the valid state may be generated. It should be noted that the counting signal may include several bits, and there is a correspondence between a quantity of bits and a quantity of flip-flops. The several bits may be configured to represent the counting value, and an upper limit value of the counting value may be determined by the quantity of flip-flops. For example, the counting signal may include eight bits if there are eight flip-flops herein, e.g., Code<7:0>. In this case, a range of the counting value corresponding to the counting signal Code<7:0> is 00000000 to 11111111.

It should be further noted that, in this embodiment of the present disclosure, level values of the ECS_CNT signal may also include a first value and a second value. For example, when the first value is logic 1 indicating a high level and the second value is logic 0 indicating a low level, it is determined that the ECS_CNT signal is in the valid state if the level value of the ECS_CNT signal is the logic 1, or it is determined that the ECS_CNT signal is in an invalid state if the level value of the ECS_CNT signal is the logic 0.

Further, for the counting circuit 2011, in a possible embodiment, the counting circuit 2011 may include an asynchronous binary counter.

The asynchronous binary counter includes several sequentially cascaded flip-flops. An input terminal (D) of each stage of flip-flop is connected to a second output terminal (inverted output terminal QB) of this stage of flip-flop. The second output terminal (inverted output terminal QB) of each stage of flip-flop is connected to a clock terminal (CK) of a next stage of flip-flop. A clock terminal (CK) of a first stage of flip-flop is connected to the first clock signal.

Figure 5:
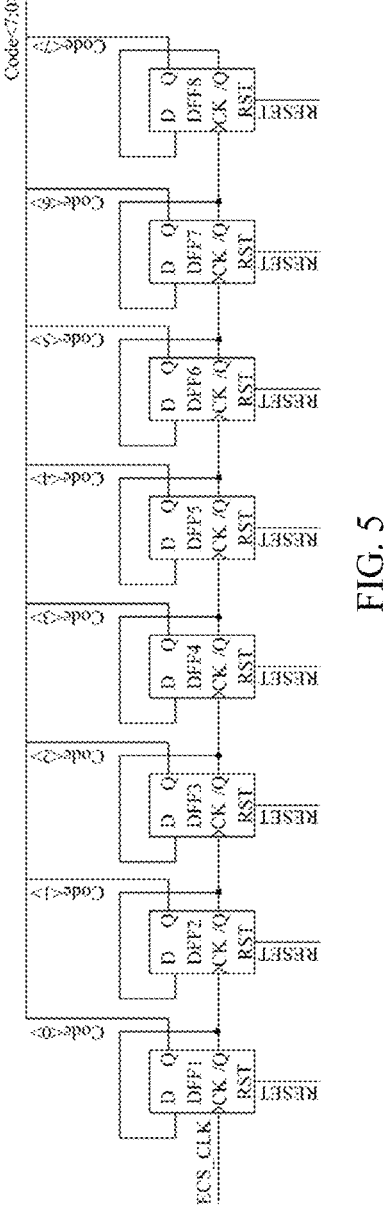
FIG. 5 is a schematic diagram of a compositional structure of an asynchronous binary counter according to an embodiment of the present disclosure.

In this embodiment of the present disclosure, the asynchronous binary counter shown in FIG. 5 is used as an example. The counting circuit 2011 includes eight flip-flops. Herein, the flip-flop may be a D-type flip-flop (Data Flip-Flop or Delay Flip-Flop, DFF). The D-type flip-flop is an information storage component having a memory function and having two stable states, is a most basic logic unit forming multiple types of timing circuits, and is also an important unit circuit in a digital logic circuit. The D-type flip-flop has two stable states, that is, "0" and "1". The flip-flop may be flipped from one stable state to the other stable state under the action of a signal received by a clock terminal of the flip-flop.

In this embodiment of the present disclosure, the flip-flop may include an input terminal (D), a clock terminal (CK), a first output terminal (Q), and a second output terminal (inverted output terminal QB, represented by /Q), and may even include a reset terminal (RST). Herein, the first output terminal (Q) of each stage of flip-flop is configured to output a corresponding bit in the counting signal, which may be specifically Code<0>, Code<1>, Code<2>, . . . , or Code<7>. The reset terminal (RST) of each stage of flip-flop is configured to receive the RESET signal, to implement a reset/clear operation of the counting circuit 2011, and then start counting again.

Further, for the counting circuit 2011, in another possible embodiment, the counting circuit 2011 may include a synchronous binary counter.

The synchronous binary counter may include several sequentially cascaded counting subcircuits. Each counting subcircuit includes a flip-flop. A clock terminal of each flip-flop is connected to the first clock signal.

The several counting subcircuits are configured to receive the first clock signal, perform clock sampling processing by the flip-flops respectively included in the counting subcircuits, and output the counting signal. The counting signal includes several bits, and there is a correspondence between the several counting subcircuits and the several bits included in the counting signal.

Briefly, in this embodiment of the present disclosure, the synchronous binary counter may include several sequentially cascaded flip-flops, and clock terminals of the several flip-flops are all connected to the first clock signal.

Further, in some embodiments, for the synchronous binary counter, details of the several counting subcircuits are as follows.

A first counting subcircuit may include a first flip-flop. An input terminal (D) of the first flip-flop is connected to a second output terminal (/Q) of the first flip-flop. A clock terminal (CK) of the first flip-flop is configured to receive the first clock signal. A first output terminal (Q) of the first flip-flop is configured to output a first counting signal. The first counting signal is a 0-th bit in the counting signal.

A second counting subcircuit may include a second flip-flop and a second XOR gate. A first input terminal of the second XOR gate is connected to the first output terminal (Q) of the first flip-flop. A second input terminal of the second XOR gate is connected to a first output terminal (Q) of the second flip-flop. An output terminal of the second XOR gate is connected to an input terminal (D) of the second flip-flop. A clock terminal (CK) of the second flip-flop is configured to receive the first clock signal. The first output terminal (Q) of the second flip-flop is configured to output a second counting signal. The second counting signal is a 1st bit in the counting signal.

An $i^{th}$ counting subcircuit may include an $i^{th}$ flip-flop, an $i^{th}$ NAND gate, an $i^{th}$ NOT gate, and an $i^{th}$ XOR gate. A first input terminal of the $i^{th}$ NAND gate is connected to a first output terminal (Q) of an $(i-1)^{th}$ flip-flop. A second input terminal of the $i^{th}$ NAND gate is connected to a first input terminal of an $(i-1)^{th}$ XOR gate. An output terminal of the $i^{th}$ NAND gate is connected to an input terminal of the $i^{th}$ NOT gate. An output terminal of the $i^{th}$ NOT gate is connected to a first input terminal of the $i^{th}$ XOR gate. A second input terminal of the $i^{th}$ XOR gate is connected to a first output terminal (Q) of the $i^{th}$ flip-flop. An output terminal of the $i^{th}$ XOR gate is connected to an input terminal of the $i^{th}$ flip-flop. A clock terminal (CK) of the $i^{th}$ flip-flop is configured to receive the first clock signal. The first output terminal (Q) of the $i^{th}$ flip-flop is configured to output an $i^{th}$ counting signal. The $i^{th}$ counting signal is an $(i-1)^{th}$ bit in the counting signal. i is an integer greater than or equal to 3 and less than or equal to M, and M is a positive integer.

Figure 6:
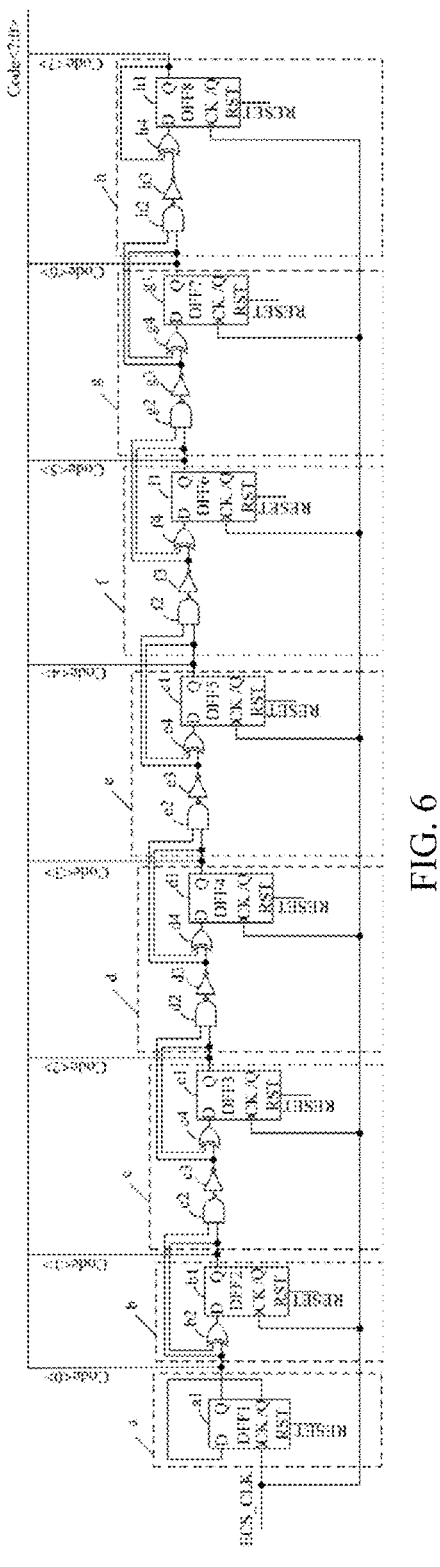
FIG. 6 is a schematic diagram of a compositional structure of a synchronous binary counter according to an embodiment of the present disclosure.

In this embodiment of the present disclosure, the synchronous binary counter shown in FIG. 6 is used as an example. The counting circuit 2011 may include eight sequentially cascaded counting subcircuits. Each counting subcircuit includes at least one flip-flop. The eight counting subcircuits are specifically: a first counting subcircuit a, a second counting subcircuit b, a third counting subcircuit c, a fourth counting subcircuit d, a fifth counting subcircuit e, a sixth counting subcircuit f, a seventh counting subcircuit g, and an eighth counting subcircuit h. Specifically, the first counting subcircuit a may include a first flip-flop a1. The first counting signal output by the first counting subcircuit a is represented by Code<0>, and corresponds to the 0-th bit in the counting signal. The second counting subcircuit b may include a second flip-flop b1 and a second XOR gate b2. The second counting signal output by the second counting subcircuit b is represented by Code<1>, and corresponds to the 1st bit in the counting signal. The third counting subcircuit c may include a third flip-flop c1, a third NAND gate c2, a third NOT gate c3, and a third XOR gate c4. A third counting signal output by the third counting subcircuit c is represented by Code<2>, and corresponds to a 2nd bit in the counting signal. The fourth counting subcircuit d may include a fourth flip-flop d1, a fourth NAND gate d2, a fourth NOT gate d3, and a fourth XOR gate d4. A fourth counting signal output by the fourth counting subcircuit d is represented by Code<3>, and corresponds to a 3rd bit in the counting signal. By analogy, for the eighth counting subcircuit h, the eighth counting subcircuit h may include an eighth flip-flop h1, an eighth NAND gate h2, an eighth NOT gate h3, and an eighth XOR gate h4. An eighth counting signal output by the eighth counting subcircuit h is represented by Code<7>, and corresponds to a 7th bit in the counting signal. In this way, the eight counting subcircuits are configured to receive the first clock signal, perform clock sampling processing by the flip-flops respectively included in the eight counting subcircuits, and output the counting signal including eight bits. There is a correspondence between the eight counting subcircuits and the eight bits included in the counting signal. For example, the first counting subcircuit is configured to output the 0-th bit Code<0> in the counting signal, the second counting subcircuit is configured to output the 1st bit Code<1> in the counting signal, the third counting subcircuit is configured to output the 2nd bit Code<2> in the counting signal, . . . , and the eighth counting subcircuit is configured to output the 7th bit Code<7> in the counting signal.

That is, the counting circuit 2011 may be an asynchronous binary counter or a synchronous binary counter. Circuit implementation of the asynchronous binary counter is simple, but using the asynchronous binary counter causes an output delay to each stage of the counter, resulting in an erroneous decoding process before a change of a last stage of counting. This may affects next time of counting. Circuit implementation of the synchronous binary counter is relatively complex, but output of each stage may be aligned when the synchronous binary counter is used, to ensure that there is no erroneous decoding process during output of the counter, thereby reducing an impact of a delay of the counter on the ECS_Flag signal.

Further, in some embodiments, for the timing control circuit 201, as shown in FIG. 4, the timing control circuit 201 may further include a latch circuit 2013 based on the control circuit 20 shown in FIG. 2. The latch circuit 2013 is connected to an output terminal of the decoding circuit 2012.

The latch circuit 2013 is configured to receive the target counting signal, and perform latch processing on the target counting signal when the target counting signal is in the valid state, to generate the ECS flag signal in the valid state.

It should be noted that, in this embodiment of the present disclosure, the latch circuit 2013 is introduced herein. The target counting signal may be generated when counting is completed. The ECS_Flag signal is generated after the target counting signal passes through the latch circuit 2013. The next refresh command signal is preempted when the ECS_Flag signal is in the valid state, to generate the ECS_CMD signal. In addition, the corresponding preempted refresh command disappears. Therefore, no refresh operation is performed during this period, but the ECS operation is performed based on the ECS_CMD signal, to ensure all error check and scrub is completed within 24 hours.

Figure 7:
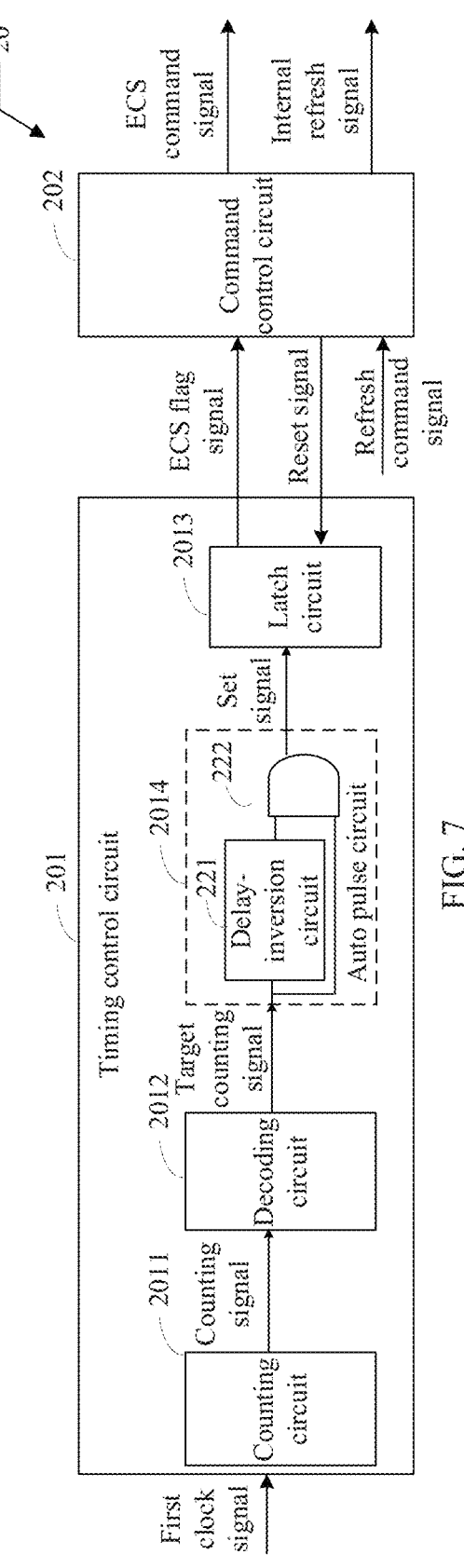
FIG. 7 is a schematic diagram 4 of a compositional structure of a control circuit according to an embodiment of the present disclosure.

Further, in some embodiments, for the timing control circuit 201, as shown in FIG. 7, the timing control circuit 201 may further include a latch circuit 2013 and an auto pulse circuit 2014 based on the control circuit 20 shown in FIG. 2. An input terminal of the auto pulse circuit 2014 is connected to an output terminal of the decoding circuit 2012. An output terminal of the auto pulse circuit 2014 is connected to a set terminal (SET) of the latch circuit 2013.

The auto pulse circuit 2014 is configured to generate a set signal based on the target counting signal. The set signal is in a valid state when the target counting signal is in the valid state.

The latch circuit 2013 is configured to receive the set signal, and generate the ECS flag signal in the valid state based on the set signal when the set signal is in the valid state.

It should be noted that the latch circuit in this embodiment of the present disclosure may be an SR latch, and the SR latch may include two two-input NAND gates. In addition, in this embodiment of the present disclosure, the SR latch includes a set terminal, a reset terminal, and an output terminal. The set terminal of the SR latch is configured to receive the set signal. The reset terminal of the SR latch is configured to receive the reset signal. The output terminal of the SR latch is configured to output the ECS flag signal.

It should be further noted that, in this embodiment of the present disclosure, the set signal may be in the valid state if the target counting signal is in the valid state; or the set signal may be in an invalid state if the target counting signal is in the invalid state. The ECS flag signal in the valid state can be generated only when the set signal is in the valid state.

It should be further noted that, in this embodiment of the present disclosure, the set signal may be represented by SET. Level values of the SET signal may also include a first value and a second value. For example, when the first value is logic 1 indicating a high level and the second value is logic 0 indicating a low level, it is determined that the SET signal is in the valid state if the level value of the SET signal is the logic 1, or it is determined that the SET signal is in the invalid state if the level value of the SET signal is the logic 0.

Further, for the auto pulse circuit 2014, in some embodiments, the auto pulse circuit 2014 may include a signal generation circuit and a first AND gate. A first input terminal of the first AND gate is connected to the output terminal of the decoding circuit 2012. A second input terminal of the first AND gate is connected to an output terminal of the signal generation circuit. An output terminal of the first AND gate (as the output terminal of the auto pulse circuit 2014) is connected to the set terminal (SET) of the latch circuit 2013.

The signal generation circuit is configured to generate an inverted target counting signal. There is a delayed and inverted relationship between the inverted target counting signal and the target counting signal.

The first AND gate is configured to perform an AND logical operation on the inverted target counting signal and the target counting signal, to obtain the set signal.

It should be noted that, in this embodiment of the present disclosure, there is the delayed and inverted relationship between the inverted target counting signal generated by the signal generation circuit and the target counting signal. In other words, delay and inversion processing may be performed on the target counting signal herein to obtain the inverted target counting signal. Then, the AND logical operation is performed on the inverted target counting signal and the target counting signal to obtain the SET signal.

That is, in this embodiment of the present disclosure, for the auto pulse circuit, an auto pulse is a relatively small pulse signal obtained by performing AND logic on the target counting signal and the inverted target counting signal obtained after delay and inversion are performed on the target counting signal. The pulse signal is used as the SET signal of the latch circuit 2013 to generate the ECS_Flag signal, so that the next refresh command signal is preempted when the ECS_Flag signal is in the valid state to generate the ECS_CMD signal.

In a specific embodiment, as shown in FIG. 7, the auto pulse circuit 2014 may include a delay-inversion circuit 221 and a first AND gate 222. Both a first input terminal of the first AND gate 222 and an input terminal of the delay-inversion circuit 221 are connected to the output terminal of the decoding circuit 2012. A second input terminal of the first AND gate 222 is connected to an output terminal of the delay-inversion circuit 221. An output terminal of the first AND gate 222 (as the output terminal of the auto pulse circuit 2014) is connected to the set terminal (SET) of the latch circuit 2013.

The delay-inversion circuit 221 is configured to perform delay and inversion processing on the target counting signal, to obtain an inverted target counting signal.

The first AND gate 222 is configured to perform an AND logical operation on the inverted target counting signal and the target counting signal, to obtain the set signal.

It should be noted that, in this embodiment of the present disclosure, the set signal is a pulse signal being valid at a high level. A longer time for delaying the target counting signal by the delay-inversion circuit indicates a wider pulse width of the set signal. A shorter time for delaying the target counting signal by the delay-inversion circuit indicates a narrower pulse width of the set signal. That is, there is a correspondence between a size of a pulse width and a time for delaying the target counting signal by the delay-inversion circuit.

It should be further noted that, in this embodiment of the present disclosure, the delay-inversion circuit may include a delay circuit and an inversion circuit connected in series. The inversion circuit may be an inverter, a NOT gate, or the like, so that delay and inversion processing can be implemented on the target counting signal.

It should be further noted that, in this embodiment of the present disclosure, the auto pulse circuit 2014 may include a delay-inversion circuit and an AND gate. Alternatively, the auto pulse circuit 2014 may include a delay-inversion circuit and a NOR gate. An input terminal of the delay-inversion circuit is configured to receive the target counting signal. An output terminal of the delay-inversion circuit is connected to a first input terminal of the NOR gate. A second input terminal of the NOR gate is configured to receive the target counting signal. An output terminal of the NOR gate is configured to output the set signal. Alternatively, the auto pulse circuit 2014 may include a delay-inversion circuit, an OR gate, and a NOT gate. An input terminal of the delay-inversion circuit is configured to receive the target counting signal. An output terminal of the delay-inversion circuit is connected to a first input terminal of the OR gate. A second input terminal of the OR gate is configured to receive the target counting signal. An output terminal of the OR gate is connected to an input terminal of the NOT gate. An output terminal of the NOT gate is configured to output the set signal. Alternatively, the auto pulse circuit 2014 may even be a combination of other logic devices, provided that a small pulse signal can be generated. An internal structure of the auto pulse circuit 2014 is not limited.

Figure 8:
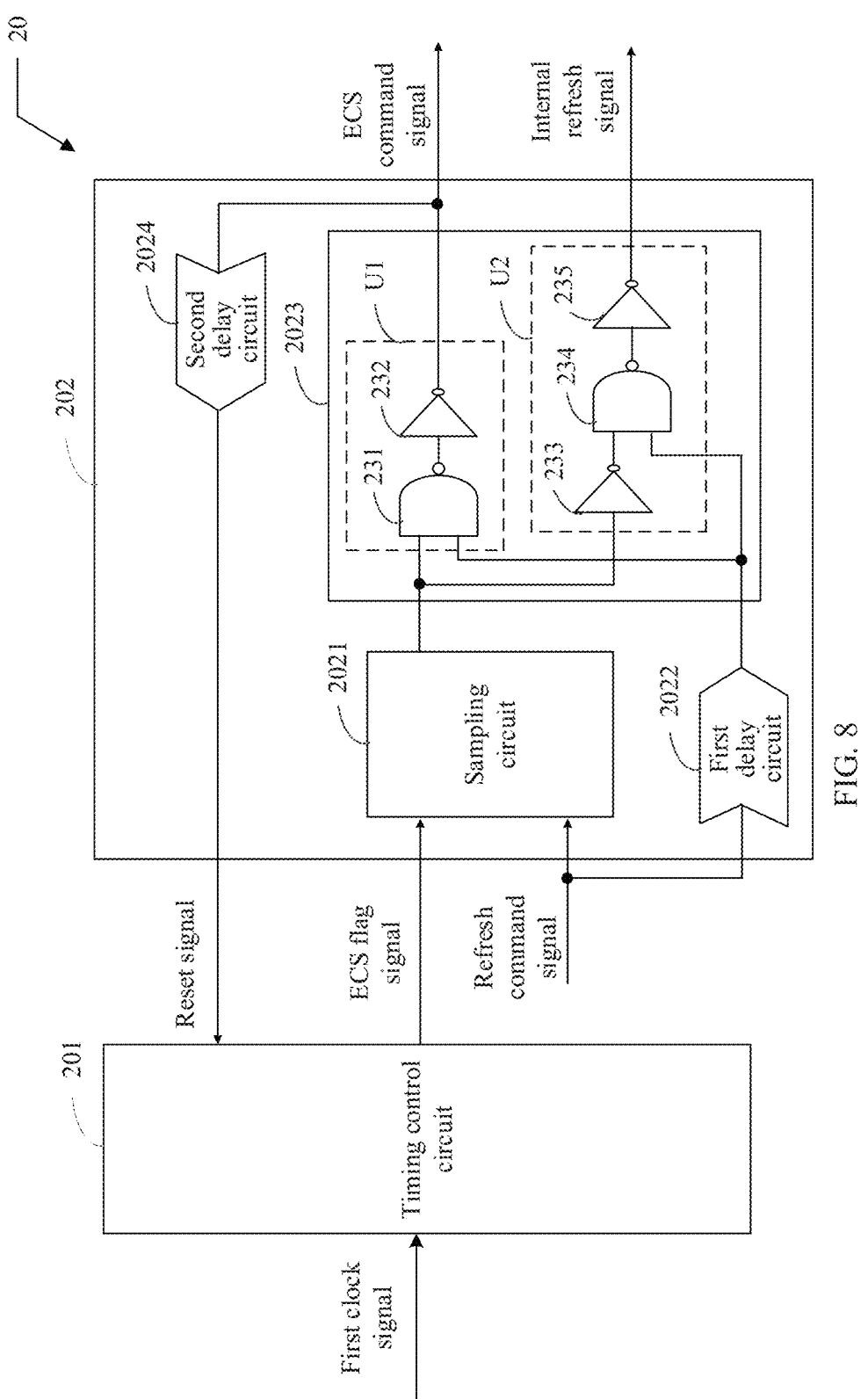
FIG. 8 is a schematic diagram 5 of a compositional structure of a control circuit according to an embodiment of the present disclosure.

Further, in some embodiments, for the command control circuit 202, as shown in FIG. 8, the command control circuit 202 may include a sampling circuit 2021, a first delay circuit

2022, and a logic processing circuit 2023 based on the control circuit 20 shown in FIG. 2.

The sampling circuit 2021 is configured to receive the refresh command signal and the ECS flag signal, and perform sampling processing on the ECS flag signal based on the refresh command signal, to obtain a sampled signal.

The first delay circuit 2022 is configured to perform delay processing on the refresh command signal, to obtain a delayed refresh signal.

The logic processing circuit 2023 is configured to perform a logical operation on the sampled signal and the delayed refresh signal, select and output, when the sampled signal is in a valid state, the ECS command signal for performing an ECS operation, and select and output, when the sampled signal is in an invalid state, an internal refresh signal for performing a refresh operation.

It should be noted that, in this embodiment of the present disclosure, the sampled signal is in the valid state when the ECS flag signal is in the valid state, and the sampled signal is in the invalid state when the ECS flag signal is in the invalid state. Level values of the sampled signal may also include a first value and a second value. For example, when the first value is logic 1 indicating a high level and the second value is logic 0 indicating a low level, it is determined that the sampled signal is in the valid state if the level value of the sampled signal is the logic 1, or it is determined that the sampled signal is in the invalid state if the level value of the sampled signal is the logic 0.

It should be further noted that, in this embodiment of the present disclosure, the sampling circuit 2021 may be a D-type flip-flop. Herein, an input terminal (D) of the D-type flip-flop is configured to receive the ECS flag signal. A clock terminal (CK) of the D-type flip-flop is configured to receive the refresh command signal. An output terminal (Q) of the D-type flip-flop is configured to output the sampled signal.

Further, in some embodiments, as shown in FIG. 8, the logic processing circuit 2023 includes a first logic circuit U1 and a second logic circuit U2 based on the control circuit 20 shown in FIG. 2.

The first logic circuit U1 is configured to perform a first logical operation on the sampled signal and the delayed refresh signal when the sampled signal is in the valid state, and output the ECS command signal, to perform the ECS operation.

The second logic circuit U2 is configured to perform a second logical operation on the sampled signal and the delayed refresh signal when the sampled signal is in the invalid state, and output the internal refresh signal, to perform the refresh operation.

It should be further noted that, in this embodiment of the present disclosure, whether to select the first logic circuit U1 to output the ECS command signal in the valid state or whether to select the second logic circuit U2 to output the internal refresh signal in a valid state may be determined based on whether the sampled signal is in the valid state. Specifically, the refresh operation is no longer performed if the ECS command signal is output. In this case, the ECS operation is performed to ensure that all error check and scrub is completed within 24 hours. The refresh operation is not affected if the internal refresh signal is output, but the ECS operation is not performed in this case.

In a possible embodiment, as shown in FIG. 8, the first logic circuit U1 includes a first NAND gate 231 and a first NOT gate 232. A first input terminal of the first NAND gate 231 is connected to an output terminal of the sampling circuit 2021. A second input terminal of the first NAND gate 231 is connected to an output terminal of the first delay circuit 2022. An output terminal of the first NAND gate 231 is connected to an input terminal of the first NOT gate 232.

The first NAND gate 231 is configured to perform a NAND logical operation on the sampled signal and the delayed refresh signal when the sampled signal is in the valid state, to obtain a first intermediate signal.

The first NOT gate 232 is configured to perform a NOT logical operation on the first intermediate signal, to obtain the ECS command signal.

In this embodiment of the present disclosure, the ECS command signal may be generated by the first logic circuit U1 when the sampled signal is in the valid state. The ECS command signal is specifically generated by preempting the next refresh command REFab/Self_REF, and the preempted refresh command disappears.

In a possible embodiment, as shown in FIG. 8, the second logic circuit U2 may include a second NOT gate 233, a second NAND gate 234, and a third NOT gate 235. An input terminal of the second NOT gate 233 is connected to the output terminal of the sampling circuit 2021. A first input terminal of the second NAND gate 234 is connected to an output terminal of the second NOT gate 233. A second input terminal of the second NAND gate 234 is connected to the output terminal of the first delay circuit 2022. An output terminal of the second NAND gate 234 is connected to an input terminal of the third NOT gate 235.

The second NOT gate 233 is configured to perform a NOT logical operation on the sampled signal when the sampled signal is in the invalid state, to obtain a second intermediate signal.

The second NAND gate 234 is configured to perform a NAND logical operation on the second intermediate signal and the delayed refresh signal, to obtain a third intermediate signal.

The third NOT gate 235 is configured to perform a NOT logical operation on the third intermediate signal, to obtain the internal refresh signal.

In this embodiment of the present disclosure, the internal refresh signal may be obtained by the second logic circuit U2 when the sampled signal is in the invalid state. Specifically, the refresh command REFab/Self_REF is directly output as the internal refresh signal. In this case, the refresh command is not preempted to generate the ECS command signal, and the refresh operation performed is not affected.

Further, as shown in FIG. 8, in some embodiments, a delay time of the first delay circuit is greater than a sum of a delay time of the sampling circuit and a delay time of the second NOT gate.

In this embodiment of the present disclosure, FIG. 8 is used as an example. The delay time of the first delay circuit 2022 needs to be greater than the sum of the delay time of the sampling circuit 2021 and the delay time of the second NOT gate 233. In other words, the first delay circuit 2022 needs to cause the delayed refresh signal to occur later than the second intermediate signal obtained after the sampled signal is inverted. Output of the sampling circuit 2021 is also the logic 1 when the ECS_Flag signal is in the valid state (e.g., the logic 1). Output of the refresh command REFab/Self_REF may be blocked by the second NOT gate 233 (whose output is the logic 0). However, there are delays in the sampling circuit 2021 and the second NOT gate 233. The refresh command REFab/Self_REF cannot be blocked if a time at which the refresh command REFab/Self_REF arrives at the second NAND gate 234 is earlier than output of the second NOT gate 233 (output when the level value of the ECS_Flag signal is the logic 1). Therefore, the refresh command REFab/Self_REF needs to be delayed by the first delay circuit 2022, so that the delayed refresh command REFab/Self_REF arrives at the second NAND gate 234 slightly later than the output of the second NOT gate 233.

Further, in some embodiments, for the command control circuit 202, as shown in FIG. 8, the command control circuit 202 may further include a second delay circuit 2024.

The second delay circuit 2024 is configured to perform delay processing on the ECS command signal, to generate the reset signal.

In this embodiment of the present disclosure, the reset signal is sent to the timing control circuit 201, so that the timing control circuit 201 starts counting again and controls the ECS flag signal to be in the invalid state. Specifically, the timing control circuit 201 shown in FIG. 7 is used as an example. The reset signal is sent to a reset terminal of the latch circuit 2013 and a reset terminal of the counting circuit 2011 after the reset signal is generated, so that the counting circuit 2011 can start counting again and control the ECS flag signal to be in the invalid state. In this way, the ECS command signal is delayed as the reset signal of the latch circuit 2013, to ensure a width of the ECS_Flag signal, so that the refresh command REFab/Self_REF can be preempted when the ECS_Flag signal is valid, to generate the ECS command signal. In this way, a technical problem that the ECS command cannot be generated based on the next refresh command because the next refresh command is far away from a counting completion moment when the counting value meets the preset condition can be further resolved with the control circuit.

An embodiment of the present disclosure provides a control circuit, which may be applied to a related circuit for performing an ECS operation in a DRAM, and is specifically a circuit capable of implementing ECS command planning and generation in an automatic ECS operation mode. In the control circuit, an ECS flag signal is in a valid state only when a counting value meets a preset condition. Then, a refresh command signal is obtained to generate an ECS command signal for performing an ECS operation. In this way, a technical problem that an ECS command signal cannot be generated based on a self-refresh signal in a related technology can be resolved, and a technical problem that an ECS command cannot be generated based on a next refresh command because the next refresh command is far away from a counting completion moment when the counting value meets the preset condition can be further resolved with the control circuit. Therefore, an interval time of the ECS operation can be better planned, to ensure completion of all error check and scrub within 24 hours.

In another embodiment of the present disclosure, based on the control circuit 20 described in the foregoing embodiment, a DDR5 DRAM is used as an example, an ECS mode allows the DRAM to read and correct a detected error code word, write corrected data back to a memory array, and record an error counting result. Herein, ECS modes include two operation modes: an automatic ECS operation mode and a manual ECS operation mode. The two operation modes may be selected through a first mode register signal MR14 OP[7]. An ECS command may be implemented with a refresh command REFab/Self_REF when the automatic ECS operation mode is selected. An MPC command is required when the manual ECS operation mode is selected. In addition, whether to perform a manual ECS operation during self-refresh may also be determined based on a second mode register signal MR15 OP[3].

In some embodiments, it is determined to select the manual ECS operation mode if a value of the first mode register signal MR14 OP[7] is 1. It is determined to select the automatic ECS operation mode if a value of the first mode register signal MR14 OP[7] is 0.

In some embodiments, in the manual ECS operation mode, it is determined to perform an ECS operation during self-refresh if the value of the second mode register signal MR15 OP[3] is 1. It is determined to not perform the ECS operation during self-refresh if the value of the second mode register signal MR15 OP[3] is 0.

Figure 9:
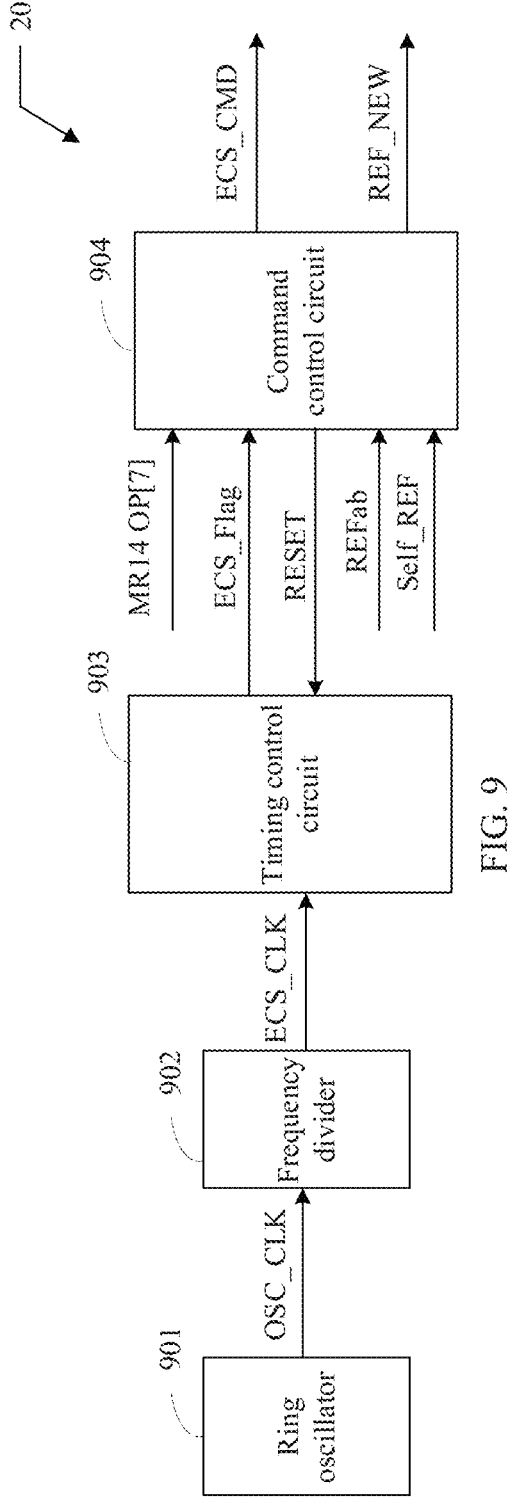
FIG. 9 is a schematic diagram 6 of a compositional structure of a control circuit according to an embodiment of the present disclosure.

FIG. 9 is a schematic diagram of a specific circuit structure of a control circuit 20 according to an embodiment of the present disclosure. As shown in FIG. 9, the control circuit 20 may include a ring oscillator 901, a frequency divider 902, a timing control circuit 903, and a command control circuit 904. A second clock signal output by the ring oscillator 901 may be represented by OSC_CLK. An output first clock signal may be represented by ECS_CLK after frequency division processing is performed on the OSC_CLK signal by the frequency divider 902. Then, after a counting operation is performed on the ECS_CLK signal by the timing control circuit 903, a generated ECS_Flag signal is in a valid state when a counting value meets a preset condition. The ECS_Flag signal is sent to the command control circuit 904. A refresh command REFab/Self_REF received at a next moment may be obtained in the circuit, and an ECS_CMD signal is generated based on the refresh command REFab/Self_REF. In addition, a first mode register signal MR14 OP[7] may be further received by the command control circuit 904 to determine whether to select an automatic ECS operation mode or a manual ECS operation mode. However, it should be noted that the timing control circuit 903 and the command control circuit 904 herein are implemented for the automatic ECS operation mode.

Specifically, the automatic ECS operation mode is selected as a default mode of a DDR5 DRAM when the first mode register signal MR14 OP[7] is equal to 0. Because it is required to perform complete error check and scrub once for full arrays in the DRAM at least within 24 hours, the timing control circuit 903 is required to plan an interval time of an ECS operation in the automatic ECS operation mode, to ensure completion of the complete error check and scrub for the full arrays within 24 hours. To resolve problems of no external clock during self-refresh, how to plan the interval time of the ECS operation, and the like, in this embodiment of the present disclosure, the ring oscillator 901 may be utilized to generate the OSC_CLK signal of a fixed frequency (with a period of 550 ns). Then, the ECS_CLK signal is output by the frequency divider 902 as a clock signal (with a period of 4.4 μs) for counting in the timing control circuit 903.

In this way, the timing control circuit 903 generates a valid ECS_Flag signal at an interval of a fixed time period based on the clock signal, and stops the counting. The ECS_Flag signal is transmitted to the command control circuit 904 for the automatic ECS operation. The next auto-refresh command REFab or self-refresh command Self_REF is preempted in the circuit to generate the ECS_CMD signal. In addition, the corresponding preempted refresh command disappears. Then, a RESET signal is generated and sent to the timing control circuit 903, so that the ECS_Flag signal is reset to an invalid value. In addition, the timing control circuit 903 is enabled to start counting again. The refresh command is not preempted and is directly output as a REF_NEW signal when the ECS_Flag signal is the invalid value. In this case, a refresh operation is not affected.

Figure 10:
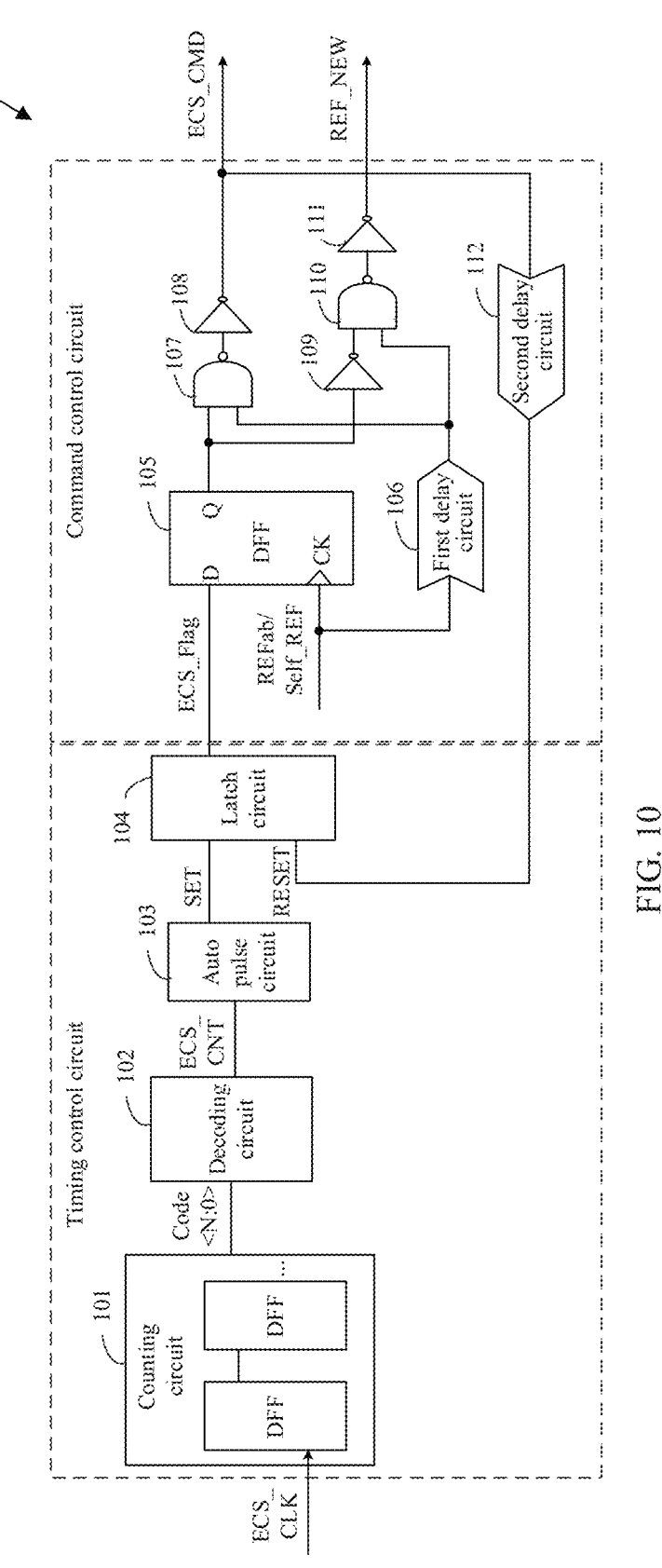
FIG. 10 is a schematic diagram 7 of a compositional structure of a control circuit according to an embodiment of the present disclosure.

In a specific embodiment, FIG. 10 is a schematic diagram of a specific circuit structure of another control circuit 20 according to an embodiment of the present disclosure. As shown in FIG. 10, the control circuit 20 may include a counting circuit 101, a decoding circuit 102, an auto pulse circuit 103, a latch circuit 104, a sampling circuit 105, a first delay circuit 106, a first NAND gate 107, a first NOT gate 108, a second NOT gate 109, a second NAND gate 110, a third NOT gate 111, and a second delay circuit 112. The counting circuit 101 may include several D-type flip-flops. For an internal structure of the counting circuit 101, refer to FIG. 5 or FIG. 6. A Code<N:0> signal is output by the counting circuit 101, and then decoding processing is performed on the Code<N:0> signal by the decoding circuit 102, to obtain an ECS_CNT signal. A SET signal may be generated after the ECS_CNT signal passes through the auto pulse circuit 103. The SET signal is a pulse signal being valid at a high level. An input terminal of the latch circuit 104 is configured to receive the SET signal. A reset terminal of the latch circuit 104 is configured to receive a RESET signal. An output terminal of the latch circuit 104 is configured to output an ECS_Flag signal. Sampling processing is performed on the ECS_Flag signal by the sampling circuit 105 to obtain a sampled signal. An ECS_CMD signal may be output through logical operations of the first delay circuit 106, the first NAND gate 107, and the first NOT gate 108 if the sampled signal is in a valid state. A REF_NEW signal may be output through logical operations of the first delay circuit 106, the second NOT gate 109, the second NAND gate 110, and the third NOT gate 111 if the sampled signal is in an invalid state. The RESET signal may be obtained by performing delay processing on the ECS_CMD signal by the second delay circuit 112. Herein, the latch circuit 104 may be an SR latch, and the sampling circuit 105 may be a D-type flip-flop. In addition, the timing control circuit includes a counting circuit 101, a decoding circuit 102, an auto pulse circuit 103, and a latch circuit 104. The command control circuit includes a sampling circuit 105, a first delay circuit 106, a first NAND gate 107, a first NOT gate 108, a second NOT gate 109, a second NAND gate 110, a third NOT gate 111, and a second delay circuit 112.

It may be understood that, in this embodiment of the present disclosure, the ECS_CLK signal is used as a clock signal of the counting circuit 101. The Code<N:0> signal is output by the counting circuit 101. The ECS_CNT signal is generated after the Code<N:0> signal passes through the decoding circuit 102 (a counting value condition is met). Then, a valid ECS_Flag signal is generated, and timing counting is stopped. The ECS_Flag signal is transmitted to the command control circuit. Then, an output signal may be changed in the command control circuit. The ECS_CMD signal is generated based on a next auto-refresh command REFab or self-refresh command Self_REF for outputting, instead of outputting an original refresh command. After the ECS_CMD signal is generated, the RESET signal is further generated by the circuit and sent to the timing control circuit, so that the ECS_Flag signal is reset to an invalid value. In addition, the timing control circuit is enabled to start counting again. The refresh command is not preempted when the ECS_Flag signal is the invalid value. Instead, the REF_NEW signal is directly transmitted, so that the refresh operation being performed is not affected. For example, if a time interval of an ECS operation is 644 μs and a period of the ECS_CLK signal is 4.4 μs, counting needs to be performed for about 644/4.4=146 times to indicate that counting is completed once.

Figure 11:
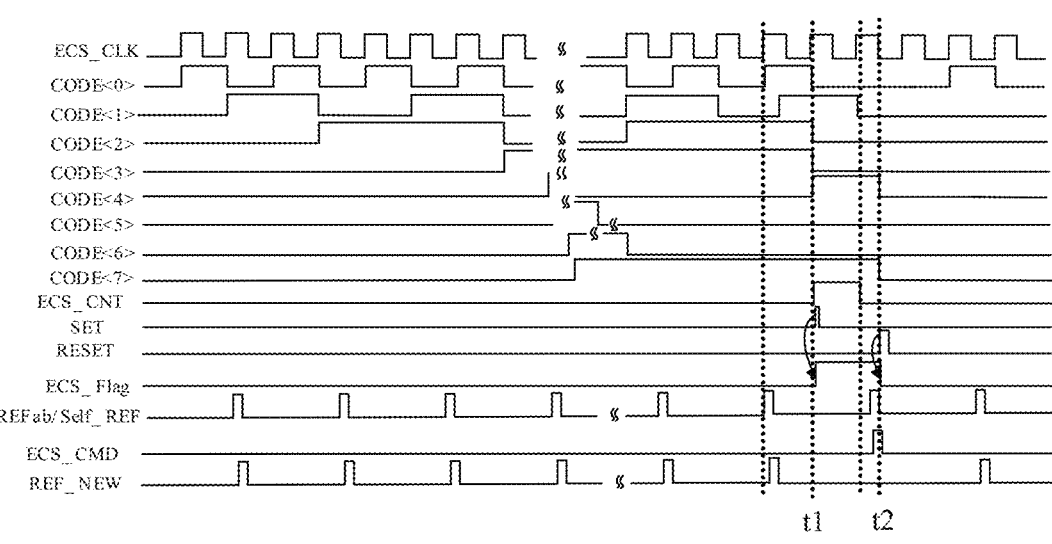
FIG. 11 is a schematic diagram of signal timing of a control circuit according to an embodiment of the present disclosure.

FIG. 11 is a schematic diagram of signal timing of a control circuit 20 according to an embodiment of the present disclosure. FIG. 11 is a signal timing waveform diagram generated in an automatic ECS operation mode. In an example in which counting is performed for 146 times, it can be learned that 146 times of counting are completed when output Code<7:0> of a counting circuit is 10010010. A valid ECS_CNT signal is generated at a moment t1 at which counting is completed. However, there is no refresh command within this time period. In this case, an ECS_Flag signal is changed from a low level state to a high level state based on a high level state of a SET signal. A refresh command REFab/Self_REF may be preempted based on a valid ECS_Flag signal when the ECS_Flag signal is at a high level, to generate an ECS command. Then, the ECS_Flag signal can be changed from the high level state to the low level state based on a high level state of a RESET signal at a moment t2. The ECS_Flag signal is a pulse signal being valid at the high level, and a pulse width can ensure that the refresh command REFab/Self_REF can be preempted when the ECS_Flag signal is valid, to generate the ECS command. That is, the ECS_Flag signal is generated through Latch of a latch circuit. The next refresh command REFab/Self_REF is preempted when ECS_Flag is a valid value, to generate an ECS_CMD signal. The preempted refresh command disappears. In addition, the counting circuit stops operating when the ECS_Flag signal is a valid value. The refresh command is not affected when ECS_Flag is an invalid value and is directly output as a REF_NEW signal, and a counter counts again.

In summary, in this embodiment of the present disclosure, the control circuit 20 may be applicable to all automatic ECS operations. Specifically, a technical problem that an ECS command signal cannot be generated based on a self-refresh command in a related technology can be resolved with the control circuit. In addition, the ECS command signal is used as the reset signal of the latch circuit after being generated by the control circuit and being subjected to delay processing, to ensure a width of the ECS_Flag signal. Therefore, it can be further ensured that the refresh command REFab/Self_REF is preempted when the ECS_Flag signal is valid, to generate the ECS command signal. That is, a technical problem that the ECS command cannot be generated based on the next refresh command because the next refresh command is far away from a counting completion moment when a counting value meets a preset condition is resolved. In addition, an interval time of an ECS operation is planned by a timing control circuit, so that the ECS command signal can be accurately generated, thereby ensuring completion of all error check and scrub within 24 hours, and finally improving memory performance.

Figure 12:
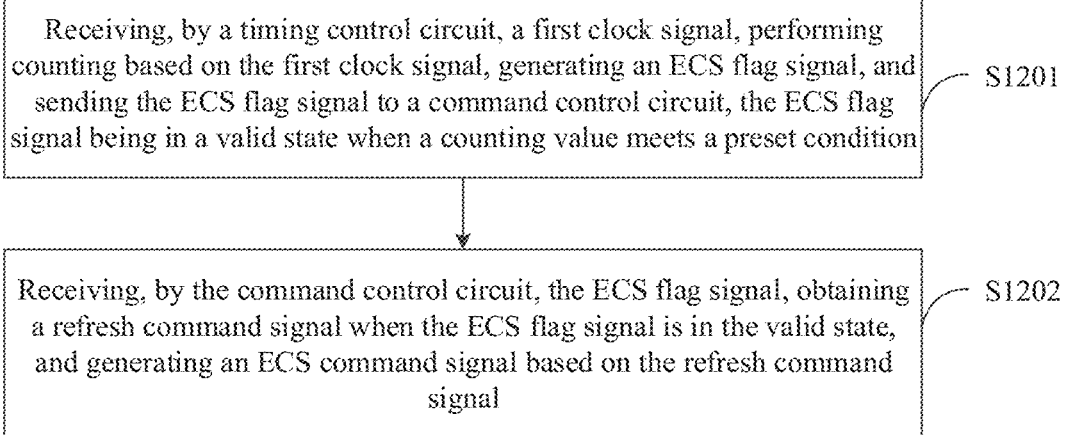
FIG. 12 is a schematic flowchart of a control method according to an embodiment of the present disclosure.

In still another embodiment of the present disclosure, FIG. 12 is a schematic flowchart of a control method according to an embodiment of the present disclosure. As shown in FIG. 12, the procedure may include the steps as follows.

In the step of S1201, a timing control circuit receives a first clock signal, performs counting based on the first clock signal, generates an ECS flag signal, and sends the ECS flag signal to a command control circuit. The ECS flag signal is in a valid state when a counting value meets a preset condition.

In the step of S1202, the command control circuit receives the ECS flag signal, obtains a refresh command signal when the ECS flag signal is in the valid state, and generates an ECS command signal based on the refresh command signal.

It should be noted that, in this embodiment of the present disclosure, the control method may be applied to the control circuit 20 in any one of the foregoing embodiments or a semiconductor memory integrated with the control circuit.

The control circuit 20 may include a timing control circuit and a command control circuit. An output terminal of the timing control circuit is connected to an input terminal of the command control circuit.

It should be further noted that, in this embodiment of the present disclosure, the timing control circuit may further stop the counting when the ECS flag signal is in the valid state. Correspondingly, in some embodiments, the method may further include a step as follows.

The command control circuit generates a reset signal after generating the ECS command signal based on the refresh command signal, and sends the reset signal to the timing control circuit, and in response to the reset signal, the timing control circuit starts counting again and controls the ECS flag signal to be in an invalid state.

Further, in some embodiments, the method may further include a step as follows. The command control circuit outputs the received refresh command signal as an internal refresh signal when the ECS flag signal is in the invalid state.

It may be understood that the timing control circuit may include a counting circuit and a decoding circuit. Correspondingly, in some embodiments, the method may further include steps as follows for the step of S1201.

The counting circuit receives the first clock signal, performs counting based on the first clock signal, and generates a counting signal. The counting signal is configured to represent a counting value.

The decoding circuit receives the counting signal, and performs decoding processing on the counting signal, to obtain a target counting signal. The target counting signal is in a valid state when the counting value meets the preset condition.

In a possible embodiment, the counting circuit includes an asynchronous binary counter. The asynchronous binary counter includes several sequentially cascaded flip-flops. An input terminal (D) of each stage of flip-flop is connected to a second output terminal (/Q) of this stage of flip-flop. The second output terminal (/Q) of each stage of flip-flop is connected to a clock terminal (CK) of a next stage of flip-flop. A clock terminal of a first stage of flip-flop is connected to the first clock signal.

In another possible embodiment, the counting circuit includes a synchronous binary counter. The synchronous binary counter includes several sequentially cascaded flip-flops. Clock terminals of the several flip-flops are all connected to the first clock signal.

In this embodiment of the present disclosure, the target counting signal is configured to generate the ECS flag signal. The timing control circuit may further include a latch circuit. Correspondingly, in some embodiments, the method may further include a step as follows.

The latch circuit receives the target counting signal, and performs latch processing on the target counting signal when the target counting signal is in the valid state, to generate the ECS flag signal in the valid state.

In addition, the timing control circuit may further include an auto pulse circuit and a latch circuit. Correspondingly, in some embodiments, the method may further include steps as follows.

The auto pulse circuit receives the target counting signal, and generates a set signal based on the target counting signal. The set signal is in a valid state when the target counting signal is in the valid state.

The latch circuit receives the set signal, and generates the ECS flag signal in the valid state based on the set signal when the set signal is in the valid state.

It may be further understood that the auto pulse circuit may include a delay-inversion circuit and a first AND gate. Correspondingly, in some embodiments, the method may further include steps as follows.

The delay-inversion circuit performs delay and inversion processing on the target counting signal, to obtain an inverted target counting signal.

The first AND gate performs an AND logical operation on the inverted target counting signal and the target counting signal, to obtain the set signal.

It may be further understood that the command control circuit may include a sampling circuit, a first delay circuit, and a logic processing circuit. Correspondingly, in some embodiments, the method may further include steps as follows for the step of S1201.

The sampling circuit receives the refresh command signal and the ECS flag signal, and performs sampling processing on the ECS flag signal based on the refresh command signal, to obtain a sampled signal.

The first delay circuit performs delay processing on the refresh command signal, to obtain a delayed refresh signal.

The logic processing circuit performs a logical operation on the sampled signal and the delayed refresh signal, selects and outputs, when the sampled signal is in a valid state, the ECS command signal for performing an ECS operation, and selects and outputs, when the sampled signal is in an invalid state, an internal refresh signal for performing a refresh operation, In this embodiment of the present disclosure, the sampled signal is in the valid state when the ECS flag signal is in the valid state; and the sampled signal is in the invalid state when the ECS flag signal is in the invalid state.

It may be further understood that the logic processing circuit may include a first logic circuit and a second logic circuit. Correspondingly, in some embodiments, the method may further include steps as follows.

The first logic circuit performs a first logical operation on the sampled signal and the delayed refresh signal when the sampled signal is in the valid state, to output the ECS command signal.

The second logic circuit performs a second logical operation on the sampled signal and the delayed refresh signal when the sampled signal is in the invalid state, to output the internal refresh signal.

Herein, the first logic circuit may include a first NAND gate and a first NOT gate. Correspondingly, in some embodiments, the method may further include steps as follows.

The first NAND gate performs a NAND logical operation on the sampled signal and the delayed refresh signal when the sampled signal is in the valid state, to obtain a first intermediate signal.

The first NOT gate performs a NOT logical operation on the first intermediate signal, to obtain the ECS command signal.

Herein, the second logic circuit includes a second NOT gate, a second NAND gate, and a third NOT gate. Correspondingly, in some embodiments, the method may further include steps as follows.

The second NOT gate performs a NOT logical operation on the sampled signal when the sampled signal is in the invalid state, to obtain a second intermediate signal.

The second NAND gate performs a NAND logical operation on the second intermediate signal and the delayed refresh signal, to obtain a third intermediate signal.

The third NOT gate performs a NOT logical operation on the third intermediate signal, to obtain the internal refresh signal.

In this embodiment of the present disclosure, a delay time of the first delay circuit is greater than a sum of a delay time of the sampling circuit and a delay time of the second NOT gate.

It may be further understood that the command control circuit may further include a second delay circuit. Correspondingly, in some embodiments, the method may further include a step as follows.

The second delay circuit performs delay processing on the ECS command signal to generate the reset signal, and sends the reset signal to a reset terminal (RST) of the latch circuit, so that the counting circuit starts counting again and controls the ECS flag signal to be in the invalid state.

It may be further understood that the control circuit may further include a clock generation circuit. Correspondingly, in some embodiments, the method may further include a step as follows. The clock generation circuit generates the first clock signal.

It may be further understood that the clock generation circuit may include an oscillation circuit and a frequency division circuit. Correspondingly, in some embodiments, the method may further include steps as follows.

The oscillation circuit outputs a second clock signal of a preset frequency.

The frequency division circuit performs n frequency division processing on the second clock signal, to obtain the first clock signal.

In this embodiment of the present disclosure, a frequency of the first clock signal is one nth of the preset frequency, and n is an integer greater than 0.

In this embodiment of the present disclosure, the refresh command signal includes at least one of an auto-refresh signal and a self-refresh signal.

This embodiment of the present disclosure provides a control method. According to the control method, an interval time of the ECS operation can be planned, and the ECS command signal can be further accurately generated, thereby ensuring completion of all error check and scrub within 24 hours, and finally improving memory performance.

Figure 13:
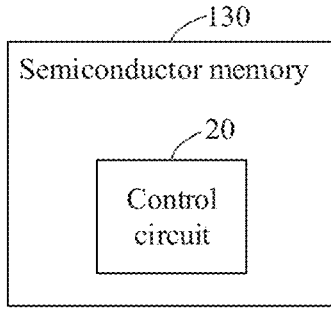
FIG. 13 is a schematic diagram of a compositional structure of a semiconductor memory according to an embodiment of the present disclosure.

In yet another embodiment of the present disclosure, FIG. 13 is a schematic diagram of a compositional structure of a semiconductor memory according to an embodiment of the present disclosure. As shown in FIG. 13, the semiconductor memory 130 includes at least the control circuit 20 described in any one of the foregoing embodiments.

In some embodiments, the semiconductor memory 130 may include a DRAM. The DRAM may not only meet memory specifications such as DDR, DDR2, DDR3, DDR4, and DDR5, but also meet memory specifications such as LPDDR, LPDDR2, LPDDR3, LPDDR4, and LPDDR5. This is not limited herein.

In this embodiment of the present disclosure, the semiconductor memory 130 mainly relates to an automatic error check and scrub circuit design in an integrated circuit design, and in particular, relates to a DRAM DDR5 chip requiring complete error check and scrub performed once at least every 24 hours. A DDR5 technical specification specifies that an ECS command needs to be planned and generated during auto-refresh and self-refresh in an automatic ECS operation mode, to check wrong information and perform internal read/write error check and correction. That is, this embodiment of the present disclosure may be applied to a related circuit for performing an error check and scrub function in the DRAM DDR5 chip, but is not limited thereto. Another command planning and generation circuit and another counting timing control circuit may use the circuit design of this embodiment of the present disclosure.

In this way, for the semiconductor memory 130, counting is performed based on a first clock signal after the first clock signal is received, an ECS flag signal is in a valid state only when a counting value meets a preset condition, and a refresh command signal is obtained to generate an ECS command signal for performing an ECS operation. Therefore, a technical problem that an ECS command signal cannot be generated through self-refresh in a related technology can be resolved, and a technical problem that an ECS command cannot be generated based on a next refresh command because the next refresh command is far away from a counting completion moment when the counting value meets the preset condition can be further resolved with the control circuit. In addition, an interval time of the ECS operation is planned by a timing control circuit, so that the ECS command signal can be accurately generated, thereby ensuring completion of all error check and scrub within 24 hours, and finally improving memory performance.

The foregoing descriptions are merely example embodiments of the present disclosure, and are not intended to limit the protection scope of the present disclosure.

It should be noted that in the present disclosure, the terms "include", "comprise", or any other variant thereof are intended to cover non-exclusive inclusion, so that a process, method, article, or apparatus that includes a series of elements includes not only those elements but also other elements that are not expressly listed, or further includes elements inherent to such a process, method, article, or apparatus. An element preceded by "includes a . . . " does not, without more constraints, preclude the presence of additional identical elements in the process, method, article, or apparatus that includes the element.

The sequence numbers of the foregoing embodiments of the present disclosure are merely for the purpose of description, and are not intended to indicate priorities of the embodiments.

The methods disclosed in the several method embodiments provided in the present disclosure may be randomly combined when there is no conflict, to obtain new method embodiments.

The features disclosed in the several product embodiments provided in the present disclosure may be randomly combined when there is no conflict, to obtain new product embodiments.

The features disclosed in the several method or circuit embodiments provided in the present disclosure may be randomly combined when there is no conflict, to obtain new method embodiments or new circuit embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

INDUSTRIAL APPLICABILITY

In the embodiments of the present disclosure, counting is performed based on the first clock signal after the first clock signal is received. The ECS flag signal is in the valid state only when the counting value meets the preset condition. Then, the refresh command signal is obtained to generate the ECS command signal for performing the ECS operation. Therefore, a technical problem that an ECS command signal cannot be generated based on a self-refresh command in a related technology can be resolved. In addition, the interval time of the ECS operation is planned by the timing control circuit, so that the ECS command signal can be accurately generated, thereby ensuring completion of all error check and scrub within 24 hours, and finally improving memory performance.

What is claimed is:

1. A control circuit, comprising a timing control circuit and a command control circuit, an output terminal of the timing control circuit being connected to an input terminal of the command control circuit; and, wherein the timing control circuit is configured to receive a first clock signal, perform counting based on the first clock signal, generate an error check and scrub (ECS) flag signal, and send the ECS flag signal to the command control circuit, the ECS flag signal being in a valid state when a counting value meets a preset condition; and the command control circuit is configured to receive the ECS flag signal, obtain a refresh command signal when the ECS flag signal is in the valid state, and generate an ECS command signal based on the refresh command signal.

2. The control circuit according to claim 1, wherein the timing control circuit is further configured to stop the counting when the ECS flag signal is in the valid state; and the command control circuit is further configured to generate a reset signal after generating the ECS command signal based on the refresh command signal, and send the reset signal to the timing control circuit, and in response to the reset signal, the timing control circuit starts counting again and controls the ECS flag signal to be in an invalid state.

3. The control circuit according to claim 2, wherein the command control circuit is further configured to output the received refresh command signal as an internal refresh signal when the ECS flag signal is in the invalid state.

4. The control circuit according to claim 2, wherein the timing control circuit comprises a counting circuit and a decoding circuit, and an output terminal of the counting circuit is connected to an input terminal of the decoding circuit;

the counting circuit is configured to receive the first clock signal, perform counting based on the first clock signal, and generate a counting signal, the counting signal being configured to represent a counting value; and the decoding circuit is configured to receive the counting signal, and perform decoding processing on the counting signal, to obtain a target counting signal, the target counting signal being in a valid state when the counting value meets the preset condition.

5. The control circuit according to claim 4, wherein the counting circuit comprises an asynchronous binary counter; and the asynchronous binary counter comprises several sequentially cascaded flip-flops, an input terminal of each stage of flip-flop is connected to a second output terminal of this stage of flip-flop, a second output terminal of each stage of flip-flop is connected to a clock terminal of a next stage of flip-flop, and a clock terminal of a first stage of flip-flop is connected to the first clock signal.

6. The control circuit according to claim 4, wherein the counting circuit comprises a synchronous binary counter; and the synchronous binary counter comprises several sequentially cascaded flip-flops, and clock terminals of the several flip-flops are all connected to the first clock signal.

7. The control circuit according to claim 4, wherein the timing control circuit further comprises a latch circuit, and the latch circuit is connected to an output terminal of the decoding circuit; and the latch circuit is configured to receive the target counting signal, and perform latch processing on the target counting signal when the target counting signal is in the valid state, to generate the ECS flag signal in the valid state.

8. The control circuit according to claim 4, wherein the timing control circuit further comprises an auto pulse circuit and a latch circuit, an input terminal of the auto pulse circuit is connected to an output terminal of the decoding circuit, and an output terminal of the auto pulse circuit is connected to a set terminal of the latch circuit;

the auto pulse circuit is configured to generate a set signal based on the target counting signal, the set signal being in a valid state when the target counting signal is in the valid state; and the latch circuit is configured to receive the set signal, and generate the ECS flag signal in the valid state based on the set signal when the set signal is in the valid state.

9. The control circuit according to claim 8, wherein the auto pulse circuit comprises a delay-inversion circuit and a first AND gate, both a first input terminal of the first AND gate and an input terminal of the delay-inversion circuit are connected to the output terminal of the decoding circuit, a second input terminal of the first AND gate is connected to an output terminal of the delay-inversion circuit, and an output terminal of the first AND gate, as the output terminal of the auto pulse circuit, is connected to the set terminal of the latch circuit;

the delay-inversion circuit is configured to perform delay and inversion processing on the target counting signal, to obtain an inverted target counting signal; and the first AND gate is configured to perform an AND logical operation on the inverted target counting signal and the target counting signal, to obtain the set signal.

10. The control circuit according to claim 2, wherein the command control circuit comprises a sampling circuit, a first delay circuit, and a logic processing circuit; and, wherein the sampling circuit is configured to receive the refresh command signal and the ECS flag signal, and perform sampling processing on the ECS flag signal based on the refresh command signal, to obtain a sampled signal;

the first delay circuit is configured to perform delay processing on the refresh command signal, to obtain a delayed refresh signal;

the logic processing circuit is configured to perform a logical operation on the sampled signal and the delayed refresh signal, select and output, when the sampled signal is in a valid state, the ECS command signal for performing an ECS operation, and select and output, when the sampled signal is in an invalid state, an internal refresh signal for performing a refresh operation; and the sampled signal is in the valid state when the ECS flag signal is in the valid state, and the sampled signal is in the invalid state when the ECS flag signal is in the invalid state.

11. The control circuit according to claim 10, wherein the logic processing circuit comprises a first logic circuit and a second logic circuit; and, wherein the first logic circuit is configured to perform a first logical operation on the sampled signal and the delayed refresh signal when the sampled signal is in the valid state, to output the ECS command signal; and the second logic circuit is configured to perform a second logical operation on the sampled signal and the delayed refresh signal when the sampled signal is in the invalid state, to output the internal refresh signal.

12. The control circuit according to claim 11, wherein the first logic circuit comprises a first NAND gate and a first NOT gate, a first input terminal of the first NAND gate is connected to an output terminal of the sampling circuit, a second input terminal of the first NAND gate is connected to an output terminal of the first delay circuit, and an output terminal of the first NAND gate is connected to an input terminal of the first NOT gate;

the first NAND gate is configured to perform a NAND logical operation on the sampled signal and the delayed refresh signal when the sampled signal is in the valid state, to obtain a first intermediate signal; and the first NOT gate is configured to perform a NOT logical operation on the first intermediate signal, to obtain the ECS command signal;

the second logic circuit comprises a second NAND gate, a second NOT gate, and a third NOT gate, a first input terminal of the second NAND gate is connected to an output terminal of the second NOT gate, a second input terminal of the second NAND gate is connected to an output terminal of the first delay circuit, and an output terminal of the second NAND gate is connected to an input terminal of the third NOT gate;

the second NOT gate is configured to perform a NOT logical operation on the sampled signal when the sampled signal is in the invalid state, to obtain a second intermediate signal;

the second NAND gate is configured to perform a NAND logical operation on the second intermediate signal and the delayed refresh signal, to obtain a third intermediate signal; and the third NOT gate is configured to perform a NOT logical operation on the third intermediate signal, to obtain the internal refresh signal.

13. The control circuit according to claim 12, wherein a delay time of the first delay circuit is greater than a sum of a delay time of the sampling circuit and a delay time of the second NOT gate.

14. The control circuit according to claim 8, wherein the command control circuit further comprises a second delay circuit; and the second delay circuit is configured to perform delay processing on the ECS command signal to generate the reset signal, and send the reset signal to a reset terminal of the latch circuit, so that the counting circuit starts counting again and controls the ECS flag signal to be in the invalid state.

15. The control circuit according to claim 1, wherein the control circuit further comprises a clock generation circuit; and the clock generation circuit is configured to generate the first clock signal.

16. The control circuit according to claim 15, wherein the clock generation circuit comprises an oscillation circuit and a frequency division circuit;

the oscillation circuit is configured to output a second clock signal of a preset frequency;

the frequency division circuit is configured to perform n frequency division processing on the second clock signal, to obtain the first clock signal; and a frequency of the first clock signal is one nth of the preset frequency, and n is an integer greater than 0.

17. The control circuit according to claim 1, wherein the refresh command signal comprises at least one of an auto-refresh signal and a self-refresh signal.

18. A control method, comprising:

receiving, by a timing control circuit, a first clock signal, performing counting based on the first clock signal, generating an ECS flag signal, and sending the ECS flag signal to a command control circuit, the ECS flag signal being in a valid state when a counting value meets a preset condition; and receiving, by the command control circuit, the ECS flag signal, obtaining a refresh command signal when the ECS flag signal is in the valid state, and generating an ECS command signal based on the refresh command signal.

19. A semiconductor memory, comprising the control circuit according to claim 1.

20. The semiconductor memory according to claim 19, wherein the semiconductor memory comprises a dynamic random access memory (DRAM).

\* \* \* \* \*